US012761306B2

(12) United States Patent
Zhao et al.

(10) Patent No.: US 12,761,306 B2
(45) Date of Patent: Oct. 13, 2026

(54) VENC DESIGN AND VELOCITY ESTIMATION FOR PHASE CONTRAST MRI

(71) Applicant: Ohio State Innovation Foundation, Columbus, OH (US)

(72) Inventors: Shen Zhao, Sunnyvale, CA (US); Rizwan Ahmad, Hilliard, OH (US); Lee Potter, Riverlea, OH (US); David Tucker, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 107 days.

(21) Appl. No.: 18/850,642

(22) PCT Filed: Mar. 27, 2023

(86) PCT No.: PCT/US2023/016414
§ 371 (c)(1),
(2) Date: Sep. 25, 2024

(87) PCT Pub. No.: WO2023/192179
PCT Pub. Date: Oct. 5, 2023

(65) Prior Publication Data

US 2025/0224473 A1 Jul. 10, 2025

Related U.S. Application Data

(60) Provisional application No. 63/324,133, filed on Mar. 27, 2022.

(51) Int. Cl.

| | |
|---|---|
| ***G01R 33/56*** | (2006.01) |
| ***G01R 33/563*** | (2006.01) |
| ***G01R 33/565*** | (2006.01) |

(52) U.S. Cl.
CPC . *G01R 33/56316* (2013.01); *G01R 33/56545* (2013.01)

(58) Field of Classification Search
CPC .................... G01R 33/56316; G01R 33/56545
See application file for complete search history.

(56) References Cited

U.S. PATENT DOCUMENTS

2008/0007450 A1* 1/2008 Yedidia ................ G01S 13/904 342/195
2014/0316250 A1 10/2014 Ahmad et al.
(Continued)

OTHER PUBLICATIONS

International Search Report and Written Opinion, dated Aug. 11, 2023, received in connection with corresponding International Patent Application No. PCT/US2023/016414.
(Continued)

*Primary Examiner* — G.M. A Hyder
(74) *Attorney, Agent, or Firm* — Meunier Carlin & Curfman LLC

(57) ABSTRACT

Systems and methods to implement Phase Recovery from Multiple Wrapped Measurements (PRoM) as a fast, approximate maximum likelihood estimator of velocity from multi-coil data with possible amplitude attenuation due to dephasing. The estimator can recover the fullest possible extent of unambiguous velocities, which can exceed four times the highest venc. The estimator uses all pairwise phase differences and the inherent correlations among them to minimize the estimation error. Derivation of the estimator yields explicit probabilities of unwrapping errors and the posterior probability distribution for the velocity estimate; this in turn allows for optimized design of the phase-encoded acquisition.

20 Claims, 15 Drawing Sheets

(56) References Cited

U.S. PATENT DOCUMENTS

| | | | |
|---|---|---|---|
| 2018/0253628 | A1 | 9/2018 | Wang et al. |
| 2019/0310335 | A1 | 10/2019 | Nickel |

OTHER PUBLICATIONS

Zhao, Shen, Rizwan Ahmad, and Lee C. Potter. "Venc design and velocity estimation for phase contrast MRI." IEEE transactions on medical imaging 41.12 (2022): 3712-3724.
Zhao, Shen, Rizwan Ahmad, and Lee C. Potter. "Maximizing unambiguous velocity range in phase-contrast MRI with multipoint encoding." 2022 IEEE 19th International Symposium on Biomedical Imaging (ISBI). IEEE, 2022.
Zhao, Shen, et al. "PC-MRI with phase recovery from multiple wrapped measurements (PRoM)." Proc. 26th ISMRM Meeting & Exhibition, Paris, France. 2018.

* cited by examiner

VENC DESIGN AND VELOCITY ESTIMATION FOR PHASE CONTRAST MRI

CROSS-REFERENCE TO RELATED APPLICATION

This application is a national stage application filed under 35 U.S.C § 371 of PCT Application No. PCT/US2023/016414, filed Mar. 27, 2023, which claims the benefit of U.S. Provisional Application No. 63/324,133, filed on Mar. 27, 2022, and titled "VENC DESIGN AND VELOCITY ESTIMATION FOR PHASE CONTRAST MRI," the disclosures of which is are expressly incorporated herein by reference in their entirety.

STATEMENT REGARDING FEDERALLY FUNDED RESEARCH

This invention was made with government support under grant numbers R01HL135489 and R21EB022277 awarded by The National Institute of Health. The government has certain rights in this invention.

FIELD OF THE INVENTION

The present invention relates to magnetic resonance imaging (MRI) and more specifically to a fast, approximate maximum likelihood estimator of velocity from multi-coil data and optimized data acquisition.

BACKGROUND

Phase-contrast magnetic resonance imaging (PC-MRI) is a quantitative, non-invasive technique to measure hemodynamics in vivo. PC-MRI also enables higher dimensional velocimetry such as 4D flow imaging. Spin velocity is encoded into voxel phase via a time-varying gradient field. Lowering the first moment of the encoding gradient extends the unaliased range but degrades the velocity-to-noise ratio (VNR). To address this issue, multi-point acquisitions such as "dual-venc" have been proposed, whereby a high-venc measurement is used to unwrap a potentially wrapped, but less noisy, low-venc velocity measurement. In contrast, multiple (possibly wrapped) pairwise phase differences can be jointly processed, leading to a potentially larger unambiguous range of velocities and a reduced estimation error. Existing estimators usually employ a computationally expensive grid search and cannot guide the optimized design of the acquisition.

SUMMARY

Accordingly, the present disclosure discloses Phase Recovery from Multiple Wrapped Measurements (PRoM), an approximate maximum likelihood estimator (MLE) for a set of linear congruence equations with additive correlated noise together with implementations thereof. The estimator is used in multi-point PC-MRI to jointly process all pairwise phase differences. The PRoM estimator first constructs a set of candidate tuples of wrapping integers. The probability that the true tuple of wrapping integers is in this set is arbitrarily close to 1. For each candidate tuple, the corresponding candidate velocity is found without grid searching as a simple weighted combination of the noisy measurements. The final velocity estimate is chosen among the small set of candidate velocities to maximize the likelihood function. The search for the tuple of wrapping integers can be accelerated as a k-d tree search. The approximate MLE explicitly accommodates both intravoxel dephasing and the inherent noise correlation present among phase differences. Compared to simplified grid-search MLE, the computation of PRoM is orders of magnitude faster.

The probability distribution of the velocity estimate from noisy data is derived in closed form, which allows for the optimized design of the phase encoding. Additionally, the same estimation problem appears in other array processing applications, where PRoM extends current art to provide: a fast, grid-free estimator; accommodation of correlated noise; and, principled design of sparse array geometry. The probability distribution also enables spatial processing to exploit spatial correlations among velocity values, providing further robustness to noise.

The foregoing illustrative summary, as well as other exemplary objectives and/or advantages, and the manner in which the same are accomplished, are further explained within the following detailed description and its accompanying drawings.

BRIEF DESCRIPTION OF THE DRAWINGS

A detailed description of certain aspects of the present disclosure in accordance with various example implementations will now be provided with reference to the accompanying drawings. The drawings form a part hereof and show, by way of illustration, specific implementations and examples. In referring to the drawings, like numerals represent like elements throughout the several figures.

FIGS. 11D-11G;

FIGS. 12D-12G.

DETAILED DESCRIPTION

I. Introduction

Figure 1:
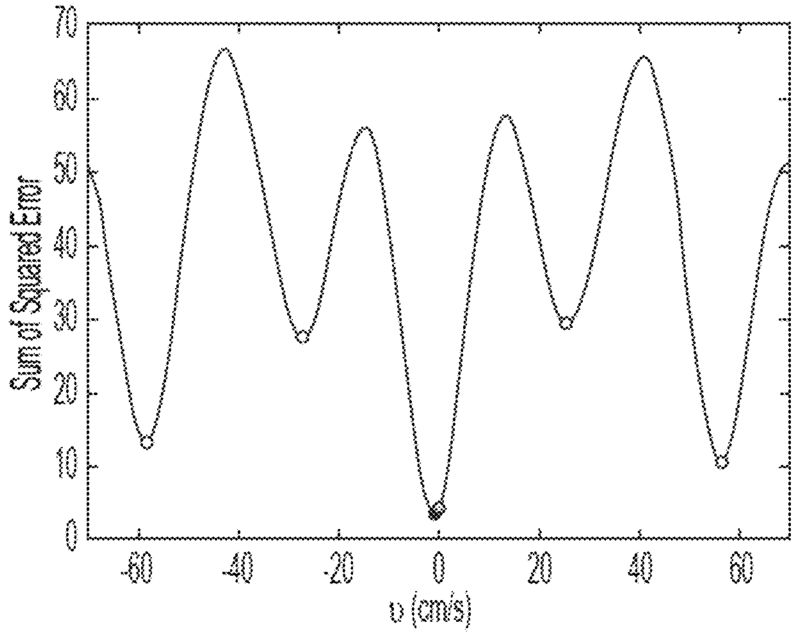
FIG. 1 illustrates the sum of squared error versus velocity using a single-coil, symmetric three-point acquisition.

The present disclosure is directed to a Phase Recovery from Multiple Wrapped Measurements (PRoM), which is a fast, approximate maximum likelihood estimator of velocity from multi-coil data with possible amplitude attenuation due to dephasing. The estimator can recover the fullest possible extent of unambiguous velocities, which can exceed four times the highest venc. The estimator uses all pairwise phase differences and the inherent correlations among them to minimize the estimation error. Derivation of the estimator yields explicit probabilities of unwrapping errors and the posterior probability distribution for the velocity estimate; this in turn allows for optimized design of the phase-encoded acquisition. Simulation, phantom, and in vivo results for three-point PC-MRI acquisitions validate the benefits of fast computation, reduced estimation error, increased recovered velocity range, and optimized acquisition. The examples presented demonstrate two orders of magnitude reduction in computational complexity and 10% decrease in root mean squared error versus conventional "dual-venc" techniques.

II. Theory

A. Phase Encoding

A time-varying magnetic gradient field may be used to encode spin velocity into image phase. Here, the velocity component is encoded in one direction. Consider a spin moving through a magnetic field; the Taylor series expansion of spin position $p(t)\in\mathbb{R}$ at t=0 yields $$p(t) = p(0) + \frac{v}{1!}t + \frac{a}{2!}t^2 + \dots , \tag{1}$$

where v is instantaneous velocity and a is acceleration. Let y be the gyromagnetic ratio, $B_0$ be the main static magnetic field strength, and $g(t)\in\mathbb{R}$ be the time-varying magnetic field gradient. Then to first order approximation of p(t), the phase accumulated from t=0 to echo time TE is $$\begin{aligned}\phi &= \int_0^{TE} \gamma B_0 + \gamma g(t)p(t)dt \\ &\approx \overbrace{\gamma B_0 TE + \gamma p(0)\underbrace{\int_0^{TE} g(t)dt}_{m_0}}^{\phi_0} + \gamma v\underbrace{\int_0^{TE} g(t)tdt}_{m_1} \\ &= \phi_0 + \gamma m_1 v,\end{aligned} \tag{2}$$

where $m_0$ and $m_1$ denote the zeroth and firs moment $g$ (t). The zeroth moment, $m_0$, encodes the spin position into phase and combines with $\gamma B_0TE$ to make the background phase, $\phi_0$. The first moment, $m_1$, encodes spin velocity into phase. So, for $N_e$-point encoding and $N_c$ coils, the integral of all spins in a voxel yields the measurement $$\tilde{y}_{\alpha\beta} = A_\alpha S_\beta e^{i(\phi_0+\gamma m_{1\alpha}v)} + \delta_{\alpha\beta}, \tag{3}$$

where $\alpha\in\{1, \dots, N_e\}$ indexes over all encodings, and $\beta\in\{1, \dots, N_c\}$ indexes over all coils. The resulting signal amplitudes are $A_\alpha\in\mathbb{R}$; $S_\beta\in\mathbb{C}$ is the coil sensitivity weight v is the resultant instantaneous velocity; $m_{1\alpha}\in\mathbb{R}$ is the first moment; $\delta_{\alpha\beta}\in\mathbb{C}$ is independent and identically distributed (i.i.d.) complex circularly symmetric Gaussian noise. This i.i.d. assumption can be aided by pre-whitening along the coil dimension. The existence of heterogeneous spin velocities and proton density can make v in (3) differ from the mean moving spin velocity (e.g., partial volume effect) and can reduce the amplitude (e.g., intravoxel dephasing effect). Generally, $A_\alpha$ decreases as $|m_{1\alpha}|$ increases.

Let $\tilde{Y}$ denote an $N_e\times N_c$ complex-valued measurement matrix with $(\alpha, \beta)^{th}$ entry $\gamma_{\alpha\beta}$, and observe that the unambiguous range of velocities for the $N_e$ encodings is $$\Omega' = LCM\left(\frac{2\pi}{\gamma m_{11}}, \dots , \frac{2\pi}{\gamma m_{1N_e}}\right), \tag{4}$$

where LCM(•) denotes least common multiple, which is the smallest positive real number that is an integer multiple of all input numbers. It follows that v and v+Ω' are indistinguishable given data, $\tilde{Y}$. Considering noise, the MLE of v involves $N_e+N_c+2$ unknowns, $\{v, \phi_0, A_1, \dots , A_{N_e}, S_1, \dots , S_{N_c}\}$, and is a nonlinear least-squares fit to the data. The optimization task can be reduced to $$\underset{s}{\text{argmax}}\ \frac{s^H\tilde{R}s}{s^Hs} \text{ s.t. } \|s\| = 1, \tag{5}$$

where $\tilde{R}\in\mathbb{C}^{N_e\times N_e}$ and the "steering vector" $s\in\mathbb{C}^{N_e\times 1}$ are $$\begin{aligned}\tilde{R} &= \tilde{Y}\tilde{Y}^H \\ s &= \left[A_1e^{i\gamma m_{11}v}, \dots , A_{N_e}e^{i\gamma m_{1N_e}v}\right]^\top.\end{aligned} \tag{6}$$

Derivation of (5) is a straightforward extension of known results to accommodate unequal amplitudes, $A_\alpha$. Here, $(\bullet)^T$ and $(\bullet)^H$ denotes transpose, and conjugate transpose. The steering vector s is determined up to scale. For a given v, the amplitudes may be found by solving (5) as a generalized eigenvalue problem; yet the optimization over v nonetheless encounters a difficult cost surface with many local minima.

A simple illustration of the sum of squared error versus velocity using a single-coil, symmetric three-point acquisition is shown in FIG. 1, which shows a sum of squared error versus velocity for a single coil, symmetric three-point acquisition.

$$\gamma[m_{11}, m_{12}, m_{13}] = \left[-\frac{\pi}{20}, \frac{\pi}{70}, \frac{\pi}{20}\right]\text{s/cm},$$

$$\left[\frac{|A_1S_1|}{\sigma(\delta_{11})}, \frac{|A_2S_1|}{\sigma(\delta_{21})}, \frac{|A_3S_1|}{\sigma(\delta_{31})}\right] = [2.5, 5, 2.5].$$

The fit error to the noisy data at the true velocity v=0 cm/s is shown by the red diamond. The global minimum at v≈−1.01 cm/s for the given noise realization is shown by the green marker. Competing local minima, shown as light blue markers, may become the global minimum due to noise, thereby causing unwrapping errors.

Data are simulated using $$\left[\frac{|A_1S_1|}{\sigma(\delta_{11})}, \frac{|A_2S_1|}{\sigma(\delta_{21})}, \frac{|A_3S_1|}{\sigma(\delta_{31})}\right] = [2.5, 5, 2.5]$$

to represent a moderate 50% loss of signal amplitude due to intravoxel dephasing. Throughout the disclosure, the same 50% is used in simulation. The fit error at the true velocity, v=0 cm/s, is shown by the red diamond, and the global minimum at v≈−1.01 cm/s for the given noise realization is shown by the green marker. Competing local minima, shown as blue markers, may become the global minimum due to noise, thereby causing unwrapping errors.

B. Estimation of Phase Noise Covariance

From (5), it can be understood that the R is a sufficient statistic for v in (3). Departing from the multi-variate optimization in (5) to instead work with the phases of the off-diagonal entries of $\tilde{R}$, the amplitudes of $\tilde{Y}$ may be used to inform the phase-to-noise ratio. In so doing, there are advantages: (1) fast, grid-free parameter estimator for velocity, v; (2) characterization of the unambiguous set of estimated velocities; (3) characterization of the probability of unwrapping errors; (4) ability to design the encodings $[m_{11}, \ldots, m_{1N_e}]$ to minimize mean squared estimation error subject to guarantees on the probability of unwrapping error and required unambiguous range. Further, the proposed surrogate estimator is asymptotically efficient, providing a very good approximation to the MLE. In this section, an approximate covariance matrix is derived for the phase measurements in $\tilde{R}$ to lay the groundwork for building the proposed estimator of v.

Observe that $\tilde{R}=\tilde{Y}\tilde{Y}^H$ performs coil combining and phase differencing. Denote the $(a, b)^{th}$ entry of $\tilde{R}$ as $\tilde{r}_{ab}$, so $$\tilde{r}_{ab} = \sum\nolimits_{\beta} \tilde{y}_{a\beta}\tilde{y}^*_{b\beta}, \tag{7}$$

where $(\bullet)^*$ denotes complex conjugation. The noisy phase difference $\tilde{\theta}_{ab}$ for encodings $a>b\in\{1, \ldots, N_e\}$ is $$\tilde{\theta}_{ab} = \angle\tilde{r}_{ab}, \tag{8}$$

where $\angle(\bullet)$ denotes angle of a complex number. This phase differencing results in venc value $$venc_{ab} = \frac{\pi}{\gamma(m_{1a} - m_{1b})}. \tag{9}$$

There are $$\frac{N_e(N_e-1)}{2}$$

such combinations. Throughout this disclosure, $venc_{ab}$ has units cm/s. Multiplying the vencs with phases, a (possibly wrapped) noisy velocity $\tilde{v}_{ab}$ may be obtained:

$$\tilde{v}_{ab} = \frac{\tilde{\theta}_{ab}}{\pi} venc_{ab}. \tag{10}$$

Phases $\tilde{\theta}_{ab}$ are unambiguous on any interval of length 2π, and for convenience [0,2π) may be used; so, $\tilde{v}_{ab}\in[0, 2venc_{ab})$. Thus, a set of noisy congruence equations for v are as follows:

$$\tilde{v}_{ab} \equiv v + n_{ab} \bmod 2venc_{ab}, \tag{11}$$

where $n_{ab}$ is additive zero mean noise. Define $k_{ab}$ as the wrapping integer for $\tilde{v}_{ab}$. Momentarily assume that the true wrapping integer, $k_{ab}$, is known; then, (11) may be rewritten as a set of linear equations:

$$\tilde{v} + k \circ 2venc = v1 + n, \tag{12}$$

where ∘ is the Hadamard (elementwise) product and $$\begin{aligned} \tilde{v} &= [\tilde{v}_{21}, \ldots, \tilde{v}_{N_e(N_e-1)}]^\top \\ k &= [k_{21}, \ldots, k_{N_e(N_e-1)}]^\top \\ venc &= [venc_{21}, \ldots, venc_{N_e(N_e-1)}]^\top \\ 1 &= [1, \ldots, 1]^\top \\ n &= [n_{21}, \ldots, n_{N_e(N_e-1)}]^\top. \end{aligned} \tag{13}$$

From the Chinese remainder theorem, the smallest Ω>0 such that v+Ω satisfies (11) is $$\Omega = LCM(2venc). \tag{14}$$

This also implies that Ω is the smallest repetition period of v to construct the same $\tilde{R}$. Recall from (4) that Ω' is a repetition period of v to construct the same $\tilde{Y}$, as well as the same $\tilde{R}$. So, Ω' is an integer multiple of Ω.

Similar to the assumption $\tilde{\theta}_{ab}\in[0,2\pi)$, assume $v\in[0, \Omega)$ for convenience of derivation. This interval could also be shifted to $$\left[-\frac{\Omega}{2}, \frac{\Omega}{2}\right),$$

for example, for bidirectional flow in MRI.

Let $\hat{v}\in[0,\Omega)$ be the linear unbiased estimator of v with smallest root mean squared error (RMSE). To compute $\hat{v}$ from the noisy $\tilde{v}$ in (12), only the covariance matrix of the noise in the remainders, Σ(n) is need. Define σ to be the standard deviation of the i.i.d. noise $\delta_{\alpha\beta}$ in (3). The mean and variance of $\tilde{r}_{ab}$ are:

$$\mathbb{E}(\tilde{r}_{ab}) = \sum\nolimits_{\beta} A_a A_b e^{i\gamma(m_{1a}-m_{1b})v}|S_\beta|^2 \tag{15}$$

$$\sigma^2(\tilde{r}_{ab}) = \sum\nolimits_{\beta} \left(\sigma^2\left(A_a^2 + A_b^2\right)|S_\beta|^2 + \sigma^4\right). \tag{16}$$

Then from (15)-(16), the squared signal-to-noise ratio (SNR), or Rician factor, for $\tilde{r}_{ab}$ is $$SNR^2(\tilde{r}_{ab}) = \frac{|\mathbb{E}(\tilde{r}_{ab})|^2}{\sigma^2(\tilde{r}_{ab})} = \frac{\left(\sum_\beta A_a A_b |S_\beta|^2\right)^2}{\sum_\beta \left(\sigma^2\left(A_a^2 + A_b^2\right)|S_\beta|^2 + \sigma^4\right)} = \frac{\left(\sum_\beta s_{a\beta} s_{b\beta}\right)^2}{\sum_\beta \left(s_{a\beta}^2 + s_{b\beta}^2 + 1\right)}, \tag{17}$$

where $$s_{a\beta} = \frac{|A_a S_\beta|}{\sigma} = SNR(\tilde{y}_{a\beta}).$$

As $SNR(\tilde{r}_{ab}) \to \infty$, $\tilde{\theta}_{ab}$ converges in distribution to a Gaussian random variable. On the contrary, as $SNR(\tilde{r}_{ab}) \to 0$, $\tilde{\theta}_{ab}$ converges in distribution to a uniformly distributed random variable on $[0, 2\pi)$. Because $$\lim_{x \to 0} \frac{x}{\sin(x)} = 1,$$

and $\sigma(\tilde{\theta}_{ab})$ conditioned on no wrapping is inversely proportional to $SNR(\tilde{r}_{ab})$, $$\sigma^2(\tilde{\theta}_{ab}) \approx \frac{1}{2SNR^2(\tilde{r}_{ab})} = \frac{\sum_\beta \left(s_{a\beta}^2 + s_{b\beta}^2 + 1\right)}{2\left(\sum_\beta s_{a\beta} s_{b\beta}\right)^2}. \tag{18}$$

Similarly, covariance can be obtained given no wrapping $$\mathrm{cov}\left(\tilde{\theta}_{ab}, \tilde{\theta}_{cb}\right) \approx \frac{|\mathrm{cov}(\tilde{r}_{ab}, \tilde{r}_{cb})|}{\sum_\beta 2 A_a A_b^2 A_c |S_\beta|^4} = \frac{N_c}{\sum_\beta 2 s_{b\beta}^2} \tag{19}$$

$$\mathrm{cov}\left(\tilde{\theta}_{ab}, \tilde{\theta}_{bd}\right) \approx \frac{-N_c}{\sum_\beta 2 s_{b\beta}^2}$$

and $\mathrm{cov}(\tilde{\theta}_{ab}, \tilde{\theta}_{cd}) = 0$ for two phase differences that do not share a common encoding.

In practice, it may be difficult to accurately estimate the noise power for each voxel, and thus hard to estimate sap. To ameliorate estimation difficulty and use complex measurements $\tilde{\gamma}_{\alpha\beta}$ only, the variance and covariance may be approximated and scaled:

$$\sigma^2(\tilde{\Theta}_{ab}) \approx \frac{\sum_\beta \left(s_{a\beta}^2 + s_{b\beta}^2\right)}{2\left(\sum_\beta s_{a\beta} s_{b\beta}\right)^2} \underset{\sim}{\propto} \frac{\sum_\beta \left(|\tilde{y}_{a\beta}|^2 + |\tilde{y}_{b\beta}|^2\right)}{2\left(\sum_\beta |\tilde{y}_{a\beta}||\tilde{y}_{b\beta}|\right)^2} \tag{20}$$

$$\mathrm{cov}\left(\tilde{\Theta}_{ab}, \tilde{\Theta}_{cb}\right) \underset{\sim}{\propto} \frac{N_c}{\sum_\beta 2|\tilde{y}_{b\beta}|^2} \tag{21}$$

where $\underset{\sim}{\propto}$ denotes "approximately proportional to." Here, the scaling factors are the same for (20) and (21). Let $$\tilde{\theta} = \left[\tilde{\theta}_{21}, \ldots, \tilde{\theta}_{N_e(N_e-1)}\right]^\top.$$

Then, with the elementwise approximations above, the scaled approximated $\Sigma(\tilde{\theta})$ can be formulated directly from observed pixel magnitudes. This scaling does not affect the estimator $\hat{v}$, as seen from (30) below. Finally, because the true covariance matrix is close to rank deficient, the elementwise approximations in (20) and (21) can potentially violate the positive semi-definite property of a covariance matrix. Accordingly, the approximation step can be followed by projection to the closest positive semi-definite matrix. This projection operator, $\Pi(\bullet)$, for a symmetric matrix M with eigen-decomposition $M = VSV^{-1}$ is given by $$\Pi(M) = V \max(S, 0) V^{-1}, \tag{22}$$

where max(S, 0) is applied elementwise to the eigenvalues.

To illustrate accuracy of covariance modeling, the cosine similarity metric is adopted, which is scale invariant. For modeled covariance $\Pi(\Sigma(\tilde{\theta}))$ and sample covariance $\tilde{\Sigma}(\theta)$, the cosine similarity is $$\frac{\mathrm{Trace}\left(\Pi\left(\sum(\tilde{\theta})\right)^H \tilde{\sum}(\theta)\right)}{\left\|\Pi\left(\sum(\tilde{\theta})\right)\right\|_F \left\|\tilde{\sum}(\theta)\right\|_F}. \tag{23}$$

Figure 2:
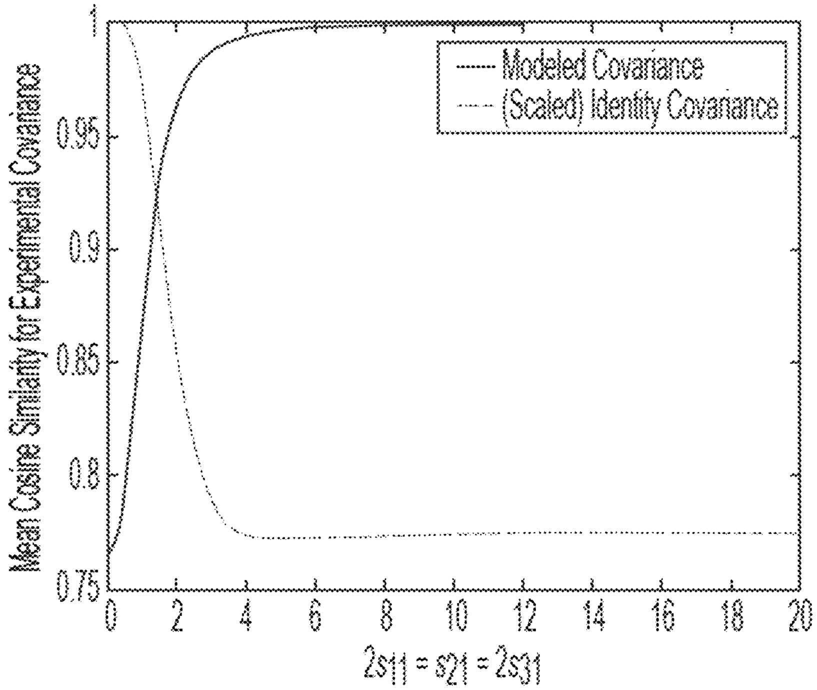
FIG. 2 illustrates similarity metric results, which shows agreement for $s_{21}>2$.

Results are computed for the case of a single-coil, symmetric encoding, and intravoxel dephasing $2s_{11} = s_{21} = 2s_{31}$; $10^6$ random draws are used at each $s_{21}$ to provide a low-variance sample covariance matrix and to compute the mean cosine similarity. FIG. 2 shows the similarity metric results, which shows excellent agreement for $s_{21} > 2$. Thus, the covariance model is accurate at modest SNR. Also shown in FIG. 2 is the similarity metric for the (scaled) identity covariance model, which is implicitly employed when using least-squares estimation with phase differences.

From (10), the wrapped velocity measurements are linearly related to the phase differences; thus, the approximated scaled positive semi-definite covariance matrix for the noise, n, in (12) conditioned on no wrapping is $$\sum(n) \underset{\sim}{\propto} \frac{1}{\pi^2} \mathrm{diag}(venc) \Pi\left(\sum(\tilde{\theta})\right) \mathrm{diag}(venc). \tag{24}$$

C. Best Linear Unbiased Estimator

Based on the covariance derivation in II-B, the estimator can now be formulated. Two suitable approximations can be adopted when the SNR is not extremely low. The first approximation is that n follows a joint Gaussian distribution with covariance matrix given in (23), $$n \sim \mathcal{N}\left(0, \sum(n)\right). \tag{25}$$

Denote the velocity estimate $\hat{v}$ given wrapping integers k as $\hat{v}_k$. Then, due to (25), $\hat{v}_k$ and its resulting RMSE given no wrapping, $\sigma(\hat{v}_k)$, are $$\hat{v}_k = \langle w^\top(\tilde{v} + k \circ 2venc)\rangle_\Omega \tag{26}$$

$$\sigma(\hat{v}_k) = w^\top \sum(n) w, \tag{27}$$

where $$w^\top = \frac{1^\top \sum^{-1}(n)}{1^\top \sum^{-1}(n) 1}, \tag{28}$$

and $\langle a \rangle_b$ denotes remainders after elementwise modulo a by b. Thus, the estimate $\hat{v}_k$ is a weighted sum of unwrapped noisy velocities.

The second assumption is $$\mathbb{P}(-venc \preccurlyeq n \preccurlyeq venc) \approx 1, \tag{29}$$

where $\preccurlyeq$ is elementwise less than or equal. This approximation yields the likelihood $\mathbb{P}(\tilde{v}|v)$ $$\mathbb{P}(\tilde{v}|v) \approx \frac{e^{-\frac{1}{2} d^\top_{2venc}(\tilde{v}, v1) \Sigma^{-1}(n) d_{2venc}(\tilde{v}, v1)}}{\det\left(2\pi \sum^{-1}(n)\right)} \tag{30}$$

where $d_z(x, y)$ is a "wrapped displacement" between x and y with respect to z, $$d_z(x, y) \triangleq x - y - \text{round}((x - y) \oslash z) \circ z, \tag{31}$$

with $\oslash$ denoting elementwise division. A search over all possible k may be performed to minimize the negative log likelihood, $$\mathcal{L}(\tilde{v}, \hat{v}_k) = \frac{1}{2} d^\top_{2venc}(\tilde{v}, \hat{v}_k 1) \sum^{-1}(n) d_{2venc}(\tilde{v}, \hat{v}_k 1). \tag{32}$$

In II-D below, a fast method to detect the best wrapping integers, k* is presented. In II-F and II-H, below, three-point encoding, $N_e=3$, is considered in order to provide concrete results and to optimize the design of venc and underlying first moments.

D. PRoM

Below is introduced a fast estimator based on (26) and detection of the wrapping integers, k. The detector and (26) are referred to together as Phase Recovery from Multiple Wrapped Measurements (PRoM). PRoM extends the prior signal processing result to accommodate correlated phase errors and to provide a fast computation of the wrapping integers. Moreover, PRoM provides a grid-free alternative to grid search over v.

Assuming $v \in [0, \Omega)$, define the set $\mathcal{K}'(V)$ of wrapping integers $$\mathcal{K}'(\tilde{v}) = \{k \mid -1 \preccurlyeq k \preccurlyeq h\} \tag{33}$$

$$h = \Omega 1 \oslash 2venc. \tag{34}$$

By (29), $\mathbb{P}(k \in \mathcal{K}'(\tilde{v})) \approx 1$. So, from (26) and (30), the negative log likelihood can be minimized $$\hat{v} = \underset{v \in [0, \Omega)}{\text{argmin}}\, \mathcal{L}(\tilde{v}, v) = \underset{v \in \{\hat{v}_k | k \in \mathcal{K}'(\tilde{v})\}}{\text{argmin}}\, \mathcal{L}(\tilde{v}, v), \tag{35}$$

with probability≈1. Next, the equality constraint in (12) is leveraged and combined with the second approximation in (29) to decrease the cardinality of $\mathcal{K}'(\tilde{v})$, denoted as $|\mathcal{K}'(\tilde{v})|$. We have $$\mathbb{P}\left(-\frac{1}{2} \preccurlyeq k + (\tilde{v} - v) \oslash (2venc) \preccurlyeq \frac{1}{2}\right) \approx 1,$$

which is equivalent to $$\mathbb{P}\left(k = \left\lceil -\frac{1}{2} - (\tilde{v} - v) \oslash (2venc) \right\rceil\right) \approx 1 \tag{36}$$

where $\lceil \cdot \rceil$ is element-wise ceiling function. Then, the pruned search set for k can be expressed $$\mathcal{K}(\tilde{v}) \triangleq \left\{ \left\lceil -\frac{1}{2} - (\tilde{v} - v) \oslash (2venc) \right\rceil \middle| v \in [0, \Omega) \right\}. \tag{37}$$

So, the parsimonious construction considers only $v \in [0, \Omega]$ such that $$-\frac{1}{2} + \frac{v - \tilde{v}_{ab}}{2venc_{ab}}$$

is integer for any $2venc_{ab}$. The cardinality of the search set $$|\mathcal{K}(\tilde{v})| \geq 1^\top h.$$

Thus, the number of searches is bounded by the summation of h instead of product of h. Then, the minimization in (35) can be reduced to $$\hat{v} = \underset{n \in \{\hat{v}_k | k \in \mathcal{K}(\tilde{v})\}}{\text{argmin}}\, \mathcal{L}(\tilde{v}, v), \tag{38}$$

with probability≈1. Together, the construction of the pruned set, $\mathcal{K}(\tilde{v})$, of candidate wrapping integers and the efficient search over $\{\hat{v}_k | k \in \mathcal{K}(\tilde{v})\}$ to minimize $\mathcal{L}(\tilde{v}, v)$ comprise PRoM, an approximate MLE of v. For a general $N_e$-point encoding, PRoM pseudo-code is below:

Algorithm 1

PRoM for $N_e$-point Encoding

```
Require: Measurements, Ỹ. First moments, m11, . . ., m1Ne.
  1: Calculate venc, ṽ, Ω, K (ṽ) via (9, 11, 14, 38).
  2: Calculate scaled Σ(n) and w via (24, 28).
  3: Calculate v̂ via (26, 39).
Ensure: v̂
```

Figure 3:
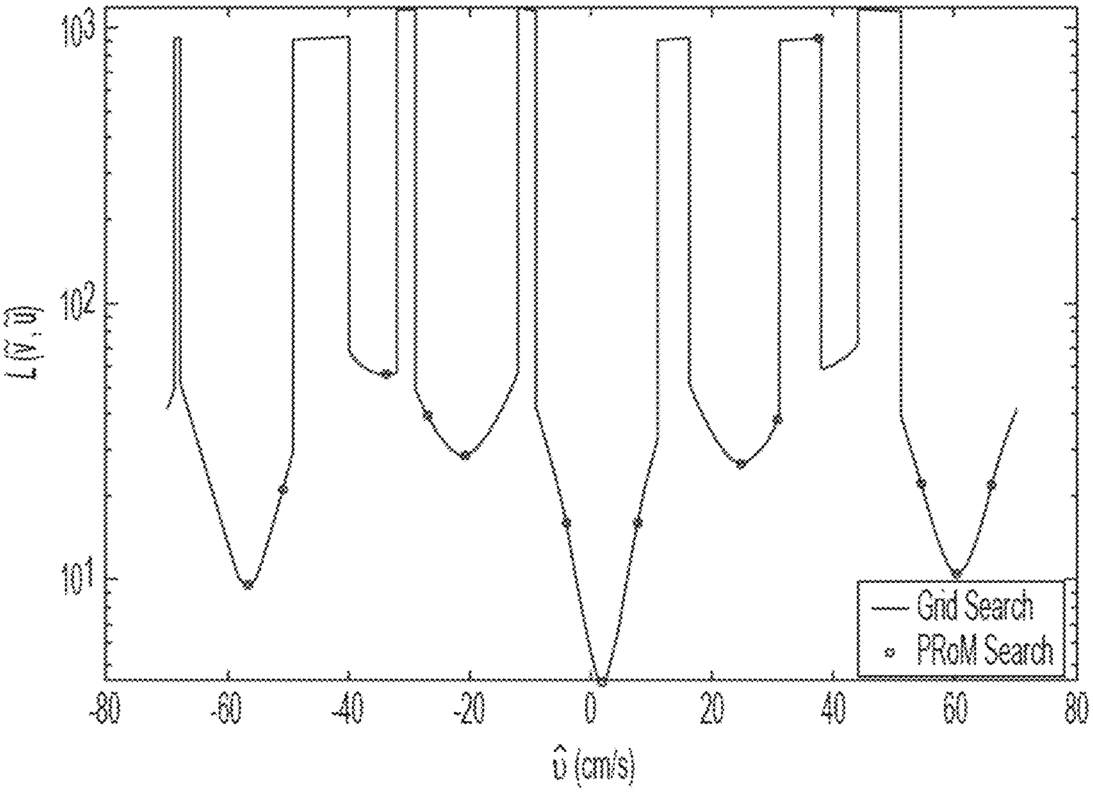
FIG. 3 illustrates $\mathcal{L}(\tilde{v}, \hat{v})$ for venc=$[35,10,14]^T$ cm/s.

FIG. 3 illustrates $\mathcal{L}(\tilde{v}, \hat{v})$ for $venc=[35,10,14]^T$ cm/s. The searched candidates $\{\hat{v}_k | k \in \mathcal{K}(\tilde{v})\}$ are marked by superimposed red dots. For this case, $|\mathcal{K}'(\tilde{v})|=252$ and $|\mathcal{K}(\tilde{v})|=14$; thus, 94% of the search space $\mathcal{K}'$ is bypassed via the proposed construction of $\mathcal{K}(\tilde{v})$. If n is known to concentrate in a smaller volume compared to the second assumption (29), or v is known and restricted to a range less than Ω, then $\mathcal{K}(\tilde{v})$ may be further pruned accordingly.

To illustrate the reduction of computation complexity in PRoM, consider the case in FIG. 3. Grid search MLE over velocity with standard spacing of $Venc_2/1000$ entails computation for 7000 candidate velocities. In contrast, PRoM only requires search over only $|\mathcal{K}(\tilde{v})|=14$ candidates, yielding a 500-times reduction.

PRoM admits a simple geometric interpretation. Observe that the noisy velocity measurement $\tilde{v}$ resides in a hyper-rectangle $\{\tilde{v}|0\preccurlyeq\tilde{v}\preccurlyeq 2venc\}$. The vector of noiseless velocity measurements $\langle v1\rangle_{2venc}$ for $v\in[0,\Omega)$ is a point in the hyper-rectangle lying on wrapped line segments parallel to 1. Then, $\hat{v}$ is found by an oblique projection of the noisy $\tilde{v}=\langle v1+n\rangle_{2venc}$ to the closest line segment. Here, the "oblique projection" is determined by the $\Sigma^{-1}(n)$ weighted distance. The search for the closest line segment is reduced to search for $k\in\mathcal{K}(\tilde{v})$.

E. Conditional Distribution of the Estimate

Below, $\mathbb{P}(\hat{v}|v)$ is derived, which is the distribution of the estimated velocity given the true velocity; this somewhat technical derivation in turn enables optimized design of venc and the underlying first moments. To derive the distribution, two lemmas are established. The first lemma indicates that adding the same constant, η, to all noise realization components does not affect the error in detecting the wrapping integers and simply adds r; to the PRoM velocity estimate, modulo Ω.

Lemma 1 For $\eta\in\mathbb{R}$, let $n'=\eta+\eta 1$ and $\tilde{v}'=\langle v1+n'\rangle_{2venc}$. Then $$\hat{v}(\tilde{v}')=\langle\hat{v}(\tilde{v})+\eta\rangle_\Omega \tag{39}$$

$$\langle k^*(\tilde{v})-k(\tilde{v})\rangle_h=\langle k^*(\tilde{v}')-k(\tilde{v}')\rangle_h. \tag{40}$$

Proof. By (31)

$$\begin{aligned} d_{2venc}(\tilde{v}',(v+\eta)1) &= d_{2venc}(\langle\tilde{v}+\eta 1\rangle_{2venc},(v+\eta)1) \\ &= d_{2venc}(\tilde{v}+\eta 1,(v+\eta)1) \\ &= d_{2venc}(\tilde{v},v1) \end{aligned}.$$

Thus $\mathcal{L}(\tilde{v},v)=\mathcal{L}(\tilde{v},v+\eta)$ and $\hat{v}(\tilde{v}')=\langle\hat{v}(\tilde{v})+\eta\rangle_\Omega$. Below estimates using k* versus the true k are estimated along the 1 direction. By (26)

$$\begin{aligned} &\langle\hat{v}(\tilde{v})-w^\top(v1+n)\rangle_\Omega \\ &=\langle w^\top(\langle k^*(\tilde{v})-k(\tilde{v})\rangle_h\circ 2venc)\rangle_\Omega, \end{aligned} \tag{41}$$

and $$\begin{aligned} &\langle\hat{v}(\tilde{v}')-w^\top(v1+n')\rangle_\Omega \\ &=\langle w^\top(\langle k^*(\tilde{v}')-k(\tilde{v}')\rangle_h\circ 2venc)\rangle_\Omega. \end{aligned} \tag{42}$$

By the previously derived $\hat{v}(\tilde{v}')=\langle\hat{v}(\tilde{v})+\eta\rangle_\Omega$, results in $$\begin{aligned} &\langle\hat{v}(\tilde{v}')-w^\top(v1+n')\rangle_\Omega \\ &=\langle\hat{v}(\tilde{v})+\eta-w^\top(v1+n)-\eta\rangle_\Omega. \\ &=\langle\hat{v}(\tilde{v})-w^\top(v1+n)\rangle_\Omega \end{aligned}$$

Thus (41) and (42) are equal for all w, and $$\langle k^*(\tilde{v})-k(\tilde{v})\rangle_h=\langle k^*(\tilde{v}')-k(\tilde{v}')\rangle_h.$$

Figure 4:
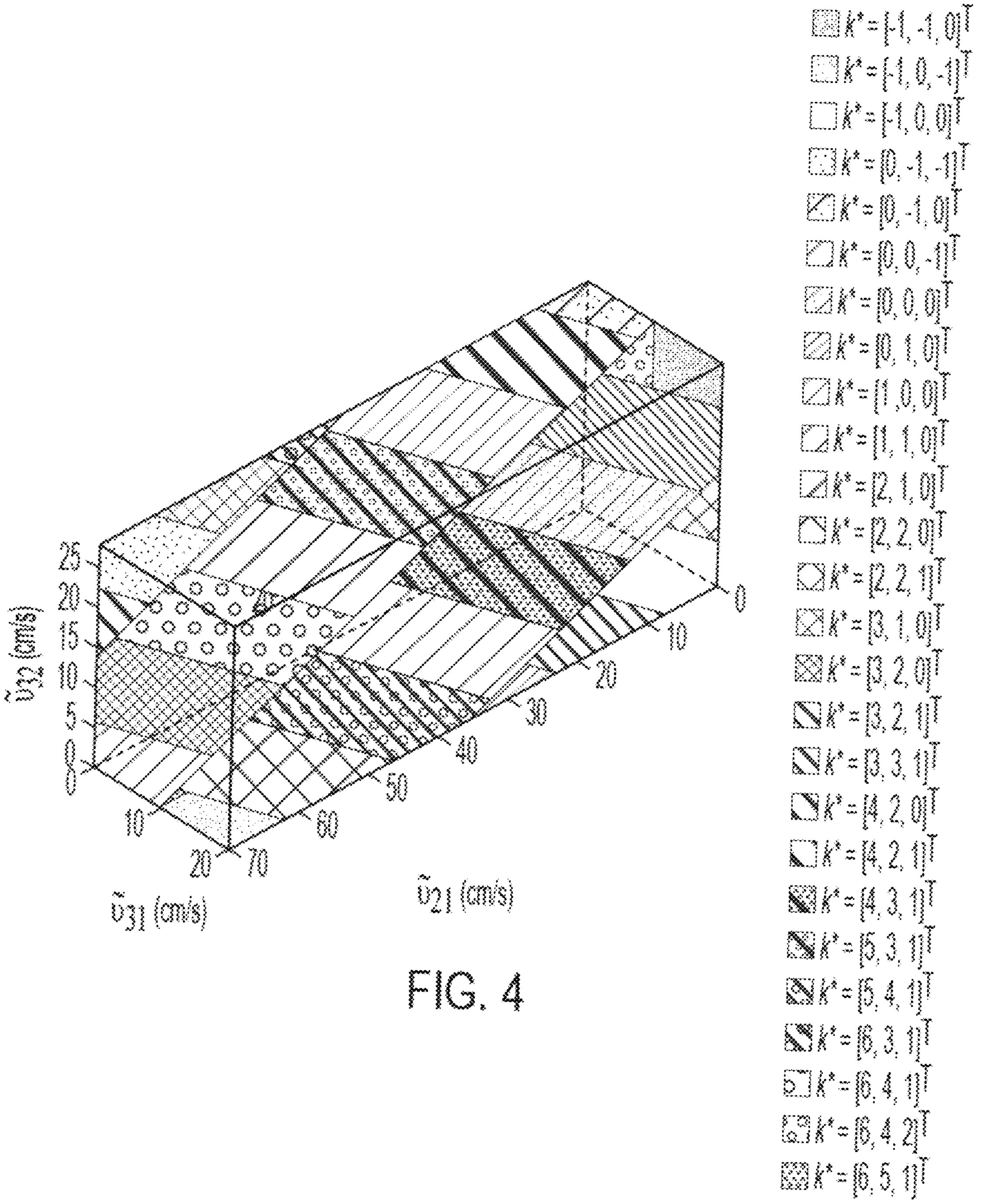
FIG. 4 provides a visualization of wrapping integers $k^*(\tilde{v})$ for the case venc=$[35,10,14]^T$, $[s_{11}, s_{21}, s_{31}]=[2.5,5,2.5]$.

FIG. 4 provides a visualization of wrapping integers $k^*(\tilde{v})$ for the case $venc=[35,10,14]^T$, $[s_{11}, s_{21}, s_{31}]=[2.5,5,2.5]$. All $\tilde{v}$ along direction 1 inside the hyper-rectangle share the same k*, which is a consequence of Lemma 1. In FIG. 4, the colored tiles for each region are drawn on the surfaces of the hyper-rectangle, and regions extend unchanged parallel to the $[1,1,1]^T$ direction, which is the direction of the line of sight in FIG. 4. PRoM detects wrapping integers for fast, accurate estimation of velocity.

In addition, $\mathcal{L}(\tilde{v}, v_k)$ as a function of $\tilde{v}$ is piece-wise quadratic with the same curvature for all k, so the decision boundaries of $k^*(\tilde{v})$ are linear, which is also illustrated in FIG. 4.

By Lemma 1, the error in wrapping integers, $\langle k^*(\tilde{v})-k(\tilde{v})\rangle_h$, remains constant for all noise realizations n along any line parallel to 1. So, the space of all possible noise realizations, $$\mathbb{R}^{\frac{N_e(N_e-1)}{2}},$$

can be divided into "tubes" $\mathcal{T}(x)$ parallel to 1, based on the difference, x, of estimated wrapping integers k* and true wrapping integers k.

$$\mathcal{T}(x)=\{n\,|\,\langle k^*(\tilde{v})-k(\tilde{v})\rangle_h=x\}. \tag{43}$$

As seen below, integration over these tubes can be performed to arrive at error probabilities for detecting the wrapping integers. Next, a second lemma is established which describes the orthogonality between pairwise noise differences and the error in the estimated velocity.

Lemma 2

$$n_{ab}-n_{cd}\perp w^\top n,\ ab\neq cd \tag{44}$$

Proof.

$$\begin{aligned} &\mathrm{cov}(w^\top n, n_{ab}-n_{cd}) \\ &= w^\top\mathbb{E}(n(n_{ab}-n_{cd})) \\ &= \frac{1^\top\sum^{-1}(n)\sum(n)(e_{ab}-e_{cd})}{1^\top\sum(n)^{-1}1}=0, \end{aligned}$$

where $e_{ab}$ is the standard basis equal to 1 at one position corresponding to $n_{ab}$ in n, and 0 otherwise.

With these two lemmas, the distribution can be specified.

Theorem 1. Given v, $\forall n\in\mathcal{T}(x)$, $\hat{v}(\tilde{v})$ follows wrapped normal distribution $\mathcal{N}(\langle v+w^T(x\cdot 2venc)\rangle_\Omega, w^T\Sigma(n)w)$.

Proof. Note that the event $n\in\mathcal{T}(x)$ is only determined by the pairwise difference of $n_{ab}-n_{cd}$ thus uncorrelated, thereby independent of $w^Tn$ by the Gaussian assumption (25). So, for all $n\in\mathcal{T}(x)$ $$\begin{aligned} \hat{v}(\tilde{v}) &= \langle w^\top(v1+x\circ 2venc+n)\rangle_\Omega \\ &= \langle v+w^T(x\circ 2venc)+w^Tn\rangle_\Omega \end{aligned}.$$

Let $f(\hat{v}|\mathcal{T}(x), v)$ denote the conditional Gaussian probability density function (pdf) in Theorem 1 without wrapping by modulo Ω. Thus, by wrapping the pdf function and invoking the law of total probability, results in $$\mathbb{P}(\hat{v}\,|\,v) = \sum_{x}\mathbb{P}(n \in \mathcal{T}(x)\,|\,v) f_{\Omega}(\hat{v}\,|\,\mathcal{T}(x), v) \tag{45}$$

$$f_{\Omega}(\hat{v}\,|\,\mathcal{T}(x), v) = \begin{cases} \sum_{l\in\mathbb{Z}} f(\hat{v}+l\Omega\,|\,\mathcal{T}(x), v), & \hat{v}\in[0,\Omega) \\ 0, & \text{otherwise} \end{cases}.$$

To complete (45), $\mathbb{P}(n\in\mathcal{T}(x)|v)$ need to be calculated by integration of a multivariate normal distribution. Leveraging Lemma 1, the integration can be simplified to a definite integration of a normal distribution in $$\frac{N_e(N_e-1)}{2} - 1$$

variables.

Figure 5A:
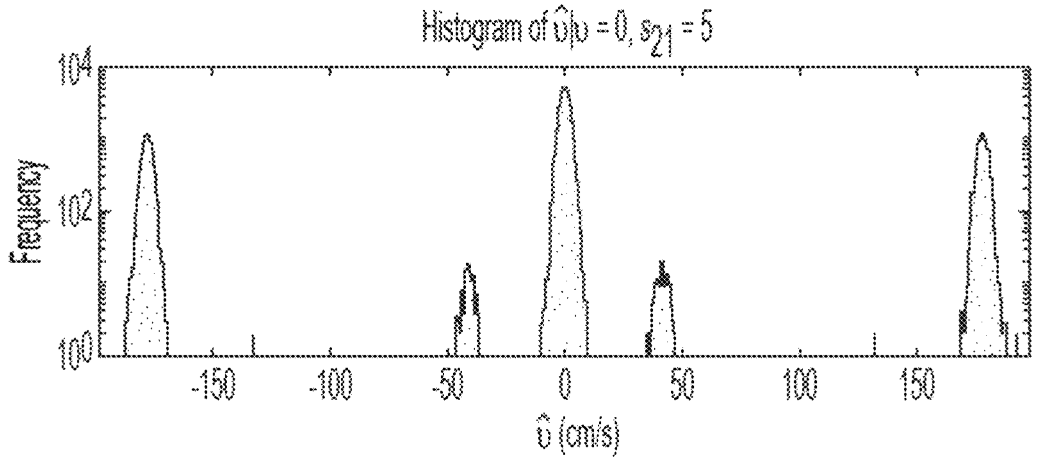
FIGS. 5A and 5B illustrate a histogram of $\hat{v}|v=0$ using $10^5$ trials, $N_e=3$, $N_c=1$, venc=$[99,18,22]^T$ cm/s at $s_{21}=5,10$.
Figure 5B:
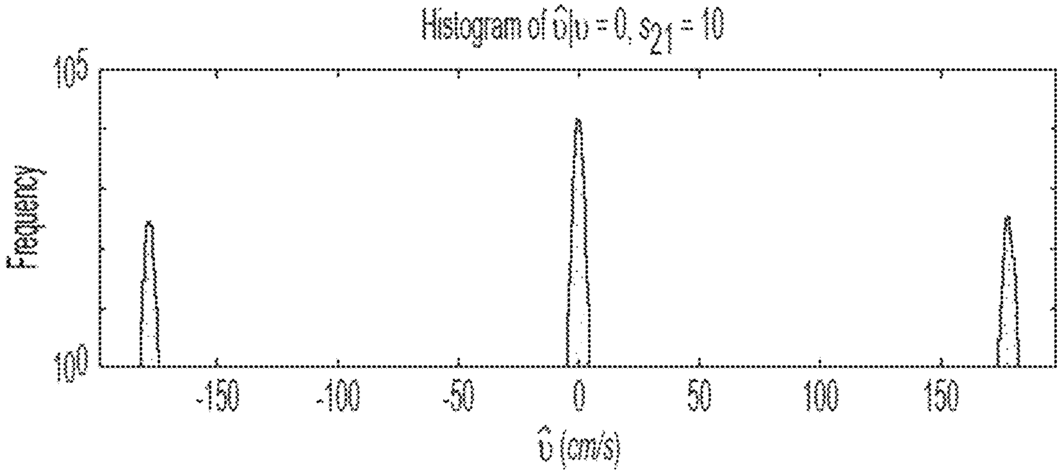

FIGS. 5A-5B illustrate the histogram of $\hat{v}|v=0$ using $10^5$ trials, $N_e=3$, $N_c=1$, venc=$[99,18,22]^T$ cm/s at $s_{21}$=5,10. Invoking Theorem 1, the five most probable wrapping integers are predicted, which correspond to detection regions $\mathcal{T}([0,0,0]^T)$, $\mathcal{T}([5,4,1]^T)$, $\mathcal{T}([6,5,1]^T)$, $\mathcal{T}([1,1,0]^T)$, and $\mathcal{T}([10,8,2]^T)$. These five predicted detections correspond to $f(\hat{v}|\mathcal{T}(x), v)$ centered at 0 (the true velocity), ±177.81, and ±40.37 cm/s; these five predictions are validated in the histogram. For the higher SNR case of $s_{21}$=10, the probability of unwrapping errors goes very small, and the $10^5$ trials are insufficient to encounter an unwrapping error to ±40.37 cm/s. In FIG. 5, the logarithmic scale for the vertical axis covering four (FIG. 5A) and five (FIG. 5B) orders of magnitude. The histogram illustrates both noise sensitivity via the spread of each Gaussian component and the probability of unwrapping errors via the presence of multiple components.

F. Three-Point Encoding

Below, a three-point encoding for velocity in one direction is described. Due to (9, 14), every $venc_{ab}$, and hence the unambiguous range, d, depends only on the differences between first moments; thus, $venc_{ab}$ and Ω are unaffected by adding the same constant to every first moment. For the first moments it is assumed:

$$m_{11} < m_{12} < m_{13},\ m_{12} - m_{11} < m_{13} - m_{11}. \tag{46}$$

Thus, the three vencs are ordered:

$$venc_{31} < venc_{32} < venc_{21}.\ \text{Let}\ \xi = \frac{venc_{32}}{venc_{31}},$$

noting that (9) and (46) imply $\xi\in(1,2)$. For rational $\xi=p/q$ with co-prime integers p and q, the unambiguous range Ω in (14) is $$\Omega = 2(p-q)venc_{21}. \tag{47}$$

Thus, by jointly unwrapping multiple vencs one can construct an unaliased velocity range that is larger than the highest venc, $venc_{21}$, by a factor of 2(p−q). The covariance matrix for three-point encoding can be formulated via (24). Correspondingly, the combination weights w can be calculated and the resulting RMSE given wrapping integers (26, 27). Armed with the explicit error variance and the probability of unwrapping errors derived below, an optimized design of venc is presented in II-H for three-point encoding with the constraint on the largest first moment, given a desired unambiguous range of velocities to be observed and SNR level for each encoding.

G. Existing Estimators for Three-Point Encoding

In the notation of (10) and (13), the unaliased high venc measurement, $\tilde{v}_{21}$, to unwrap the low venc measurement, $\tilde{v}_{31}$, is used while $venc_{32}$ goes unused. The estimator in, is denoted as standard dual-venc (SDV), is given by $$\hat{v} = \begin{cases} \tilde{v}_{21} - 4venc_{31}, & \frac{\tilde{v}_{21}-\tilde{v}_{31}}{2venc_{31}} \in (-2.4, -1.6) \\ \tilde{v}_{21} - 2venc_{31}, & \frac{\tilde{v}_{21}-\tilde{v}_{31}}{2venc_{31}} \in (-1.2, -0.8) \\ \tilde{v}_{21} + 2venc_{31}, & \frac{\tilde{v}_{21}-\tilde{v}_{31}}{2venc_{31}} \in (0.8, 1.2) \\ \tilde{v}_{21} + 4venc_{31}, & \frac{\tilde{v}_{21}-\tilde{v}_{31}}{2venc_{31}} \in (1.6, 2.4). \end{cases} \tag{48}$$

Two potentially aliased measurements $\tilde{v}_{31}$, $\tilde{v}_{32}$ are jointly unwrapped by minimizing $$\hat{v} = \underset{v\in[-\Omega/2,\Omega/2)}{\operatorname{argmin}} \sum_{l=(31,32)} \left(1 - \cos\left(\frac{\pi v}{venc_l} - \tilde{\theta}_l\right)\right). \tag{49}$$

This prior approach is called "optimal dual-venc (ODV)" herein, and the minimization is accomplished by searching $v\in[-\Omega/2,\Omega/2)$ with grid spacing $$\frac{venc_{31}}{1000}.$$

The cost adopted in ODV is equivalent to $$\frac{1}{2}\left|e^{i\frac{\pi v}{venc_{31}}} - e^{i\tilde{\theta}_{31}}\right|^2 + \frac{1}{2}\left|e^{i\frac{\pi v}{venc_{32}}} - e^{i\tilde{\theta}_{32}}\right|^2, \tag{50}$$

which intrinsically assumes no correlation between the noisy phase differences, $\tilde{\theta}_{31}$ and $\tilde{\theta}_{32}$. The ODV approach recommends $$venc_{32} = \frac{3}{2}venc_{31},$$

yielding an unambiguous velocity range of length $2venc_{21}$, which is twice the highest venc. The choice 3/2 is a heuristic to lessen the probability of unwrapping errors when minimizing (49) in the presence of noise.

The non-convex optimization (NCO) in prior work iteratively minimizes a cost similar to (50) with weights to accommodate a lower SNR in presence of intravoxel dephasing:

$$|\tilde{r}_{31}|^2\left|e^{i\frac{\pi v}{venc_{31}}} - e^{i\tilde{\theta}_{31}}\right|^2 + |\tilde{r}_{32}|^2\left|e^{i\frac{\pi v}{venc_{32}}} - e^{i\tilde{\theta}_{32}}\right|^2. \tag{51}$$

Both ODV and NCO can be applied to any number of encodings; further, the NCO algorithm also incorporates a spatial regularization across voxels in the form of the Laplacian of the velocity map.

H. Design for Three-Point Encoding

The selection of the pair $\{venc_{31}, \xi\}$ defines first moments $[m_{11}, m_{12}, m_{13}]$ up to translation. To minimize the worst intravoxel dephasing, symmetric encoding $m_{11}=-m_{13}$ may be selected; to further ameliorate intravoxel dephasing, a user-defined upper bound on the largest first moment is provided for, $m_{13} \leq m_\tau$. The choice of venc entails the interplay of noise sensitivity, probability of correct unwrapping, and the range of reliably unaliased velocities. A performance guarantee strategy is adopted for navigating these competing objectives. The design inputs are: the maximum range of velocities to be reliably detected, $\Omega_\epsilon$; a lower bound of operating measurement SNR, $s_{\alpha\beta}$; an upper bound, $m_\tau$, on the magnitude of the largest first moment; and bounds on the per-pixel probability of an unwrapping error. The design outputs are the venc and an underlying $[m_{11}, m_{12}, m_{13}]$. To formalize the notion of optimality, four definitions may be made. ⟨

Definition 1 (Unwrapping error). If $\langle k^*(\tilde{v})-k(\tilde{v})\rangle_h \neq 0$, i.e., wrapping integers are incorrectly detected, then an Unwrapping Error occurs.

Definition 2 (Aliasing error) Given no unwrapping error, if $\hat{v}_k^*$ is aliased, then an Aliasing Error occurs.

Definition 3 (ε-Reliable Range) For given measurement SNR, $s_{\alpha\beta}$, and two small numbers $\epsilon_1$, $\epsilon_2$, the $\epsilon$-reliable range $\Omega_\epsilon$ is the range of the velocities for which $\mathbb{P}$ (Unwrapping Error)$\leq \epsilon_1$ and $\mathbb{P}$ (Aliasing Error)$\leq \epsilon_2$.

Definition 3 allows specifying a reliable velocity range $\Omega_\epsilon < \Omega$ to guard against aliasing. Armed with these three definitions, a precise meaning of optimality for three-point design can be stated.

Definition 4 (Optimal venc Design) Given the SNR for the complex-valued data $s_{\alpha\beta}$, the desired maximum velocity range of length $\Omega_\epsilon$, an upper bound $m_\tau$ on the largest first moment, and unwrapping error bounds $\epsilon_1$, $\epsilon_2$, the optimal venc minimizes the RMSE among all designs for which the unwrapping and aliasing errors satisfy $\mathbb{P}$ (Unwrapping Error)$\leq \epsilon_1$ and $\mathbb{P}$ (Aliasing Error)$\leq \epsilon_2$ across the entire range of length $\Omega_\epsilon$.

Given $s_{\alpha\beta}$ and venc, $\mathbb{P}$ (Unwrapping Error) can be calculated through Monte Carlo simulation by setting v=0 and counting the trials for which $\langle k^*-k \rangle_h \neq 0$. Independence of $\mathcal{T}$ (x) on v allows simulation of v=0 to be sufficient. The number of trials is selected as $100/\epsilon_1$.

Bounding the Aliasing Error can be achieved via explicitly designing $\Omega$ different than $\Omega_\epsilon$. Let the normal cumulative distribution function be $\Phi(\bullet)$. Then, $\mathbb{P}$ (Aliasing Error) $\leq \epsilon_2$ when $$\Omega - \Omega_\epsilon \geq 2\Phi^{-1}(1-\epsilon_2)\sqrt{w^T \sum(n) w}. \tag{52}$$

The design procedure in Alg. 2 is an offline finite search to optimally design venc and the corresponding first moments. To explore design options for $\xi \in (1,2)$, rational values $\xi = p/q$ are searched among $$\left\{\frac{p}{q} \,\middle|\, gcd(p, q) = 1,\ \frac{p}{q} \in (1, 2),\ p \leq P,\ q \leq Q\right\}, \tag{53}$$

where gcd(•,•) is greatest common divisor, and $P, Q \in \mathbb{Z}^+$ are predefined upper bounds on the positive integers p, q.

The output $[m_{11}, m_{12}, m_{13}]$ of Alg. 2 is a symmetric encoding that can be translated by $\pm m_{13}$ to yield a referenced encoding; however, the referenced encoding suffers an increased risk of severe intravoxel dephasing, owing to the doubling of the largest first moment.

I. Post-Processing Using Spatial Information: PROM+

Below is presented an effective post-processing strategy paired with PRoM. The PRoM per-voxel estimation can benefit from leveraging spatial correlations among the per-voxel phase unwrapping integers. It is assumed that the noiseless velocity map u(p) belongs to a surface class U where p denotes spatial position. For example, a polynomial model has been used for the brain image phase and the Hagen-Poiseuille equation has been used for laminar blood flow throughout most of the circulatory system.

When the model is accurate, the difference between the noisy unbiased estimated and true velocity map at each location should be at the noise level, and we assume at each location the difference follows i.i.d. normal distribution with variance $1/(2\lambda)$.

From the negative log likelihood, the spatial post-processing can be expressed as minimizing the negative log likelihood $$\underset{u \in U, \hat{v}}{\operatorname{argmin}} \mathcal{L}(\tilde{v}(\rho), \hat{v}(\rho)) + \lambda(\hat{v}(\rho) - u(\rho))^2 \tag{54}$$

Here, to avoid over-smoothness due to the regularization using $u \in U$, $\hat{v}(\rho) \in \{\hat{v}_k | k \in K(\tilde{v}(\rho))\}$ may be restricted, i.e., only allow spatial information to affect k.

To optimize this spatially regularized cost, an alternating minimization strategy may be adopted. For current $\hat{v}(\rho)$, it may be fit with the best $u(\rho)$ via surface fitting. For current $u(\rho)$, the choice of $\hat{v}(\rho)$ is updated, per voxel to minimize the cost. These two steps guarantee convergence in terms of the cost function. Iterations continue to convergence, which for the integer-valued k simply means no change; no convergence threshold is required, as would be with real-valued variables. Convergence is observed in two iterations in all experiments reported below. To reduce computation, only a few most likely velocity candidates are considered. Moreover, air regions are masked-out through magnitude thresholding to reduce computation.

The PRoM estimator, together with the spatial post-processing, is denoted "PRoM+". In the section below, U is adopted for a basic non-parametric local quadratic regression for both phantom and in vivo experiments.

III. Methods

Figure 6:
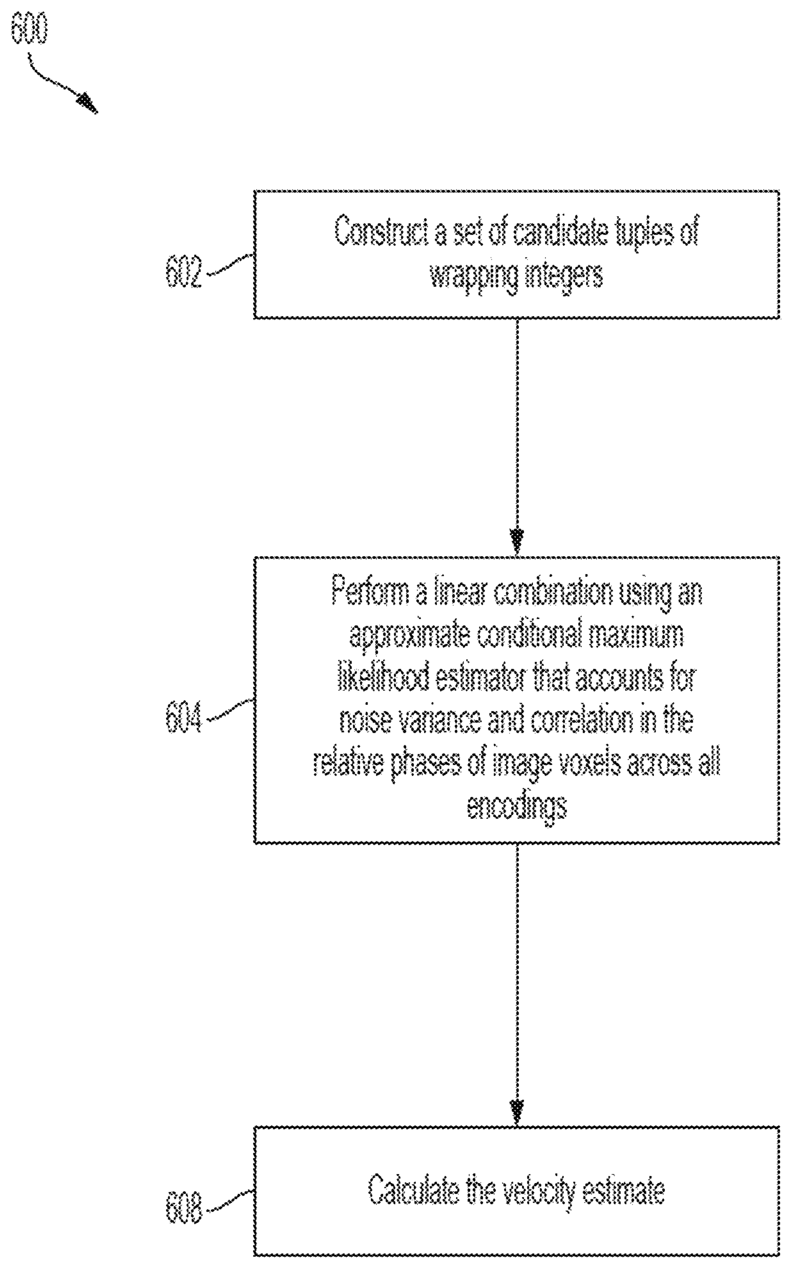
FIG. 6 illustrates an example method of implementing PRoM for $N_e$-point Encoding.

FIG. 6 illustrates an example method 600 of implementing PRoM for $N_e$-point encoding. The method 600 is a fast algorithmic procedure to estimate through-plane velocity at a voxel from three or more encoding gradients. At 602, the proposed estimator first constructs a set of candidate tuples of wrapping integers; the probability that the true tuple of wrapping integers is in this set is arbitrarily close to one. At 604, at each candidate tuple of wrapping integers, an approximate conditional maximum likelihood estimator performs a linear combination that accounts for noise variance and correlation in the relative phases of image voxels across all encodings. At 606, the estimator provides an unbiased, grid-free alternative to searching a dense grid of possible velocity estimates.

A. Simulation

To validate the two assumptions (25, 29) used in PRoM, the RMSE values for PRoM and for grid search MLE are compared to the square root of the Cramer-Rao lower bound (CRLB) derived from complex measurements in (3). Results are computed for venc=$[15,6,10]^T$ cm/s and 50% intravoxel dephasing of amplitudes for high first moments: $2s_{11}=s_{21}=2s_{31}$. RMSE values for both the MLE from the complex measurements and PRoM are each calculated using $10^5$ trials, where the grid search of MLE on v has spacing 0.006 cm/s to avoid bias from gridding.

Algorithm 2 PRoM Optimal Design for Three-Point Encoding

Require: P, Q, $s_{\alpha\beta}$, $\Omega_c$, $\gamma_1$, $\gamma_2$, $m_\tau$ $\sigma \leftarrow \infty$, $p \leftarrow 2$
while $p \le P$ do
  $q \leftarrow 1$
  while $q \le Q$ do
    if $gcd(p, q) = 1$ and $\frac{p}{q} \in (1, 2)$ then
      $v \leftarrow 0$, venc $\leftarrow [pq, q(p-q), p(p-q)]$
      Simulate $\tilde{v}$ with 100 $\gamma_1^{-1}$ trials, apply *PRoM*.
      if (Frequency of $(k^*(\tilde{v})-k(\tilde{v}))_h \neq 0) < \gamma_1$ then
        $c \leftarrow \frac{\Omega_c}{3 - 2^{p/q-1}(1-\gamma_2)\left(v^* v^\top \sum(n) v^*\right)^{3/2}}$
        $c \leftarrow \max\left[c', \frac{2\pi m_\tau q(p-q)}{v}\right]$
        if $c\sqrt{w^T\Sigma(n)w} < \sigma$ then
          venc $\leftarrow$ cvenc, $\sigma \leftarrow c\sqrt{w^T\Sigma(n)w}$
        end if
      end if
    end if
    $q \leftarrow q + 1$
  end while
  $p \leftarrow p + 1$
end while
$m_{11} \leftarrow \frac{-\pi}{2\gamma\, venc_{31}}$, $m_{12} \leftarrow \frac{\pi}{2\gamma\, venc_{31}}, -\frac{\pi}{2\gamma\, venc_{32}}$, $m_{13} \leftarrow -m_{11}$ Ensure: venc, $[m_{11}, m_{12}, m_{13}]$ To compare the performance of PRoM versus SDV and ODV, the same measurements are processed using different estimators. Simulation parameters include: venc=$[15,6,10]^T$ cm/s, $[s_{11},s_{21},s_{31}]=[10,20,10]$, $N_c=1$ coil. The ODV estimation algorithm uses $\tilde{v}_{31},\tilde{v}_{32}$, while SDV uses $\tilde{v}_{31}$, $\tilde{v}_{21}$. RMSE is calculated averaged over $10^5$ trials at each true v on [−30,30] cm/s sampled every 0.1 cm/s.

To assess the optimized encoding design in Alg. 2, a required velocity range of [−150,150] cm/s is set and the recommended choices of symmetric three-point encoding are considered for each algorithm. Simulation parameters include: $N_c=1$ coil, $s_{21}=20$. SDV suggests using venc=$[150, 60,100]^T$ cm/s. ODV recommends $$\xi = \frac{3}{2}$$

and specifies the three vencs to be venc=$[150,50,75]^T$ cm/s. For PRoM, it is assumed intravoxel dephasing leads to $[s_{11},s_{21},s_{31}]=[10,20,10]$; other input includes [P, Q]=[10,10], $[\epsilon_1, \epsilon_2]=[10^{-7},10^{-7}]$, $\Omega_\epsilon=300$ cm/s, $$\gamma m_\tau = \frac{\pi}{50}\ \text{s/cm}.$$

The design procedure in Alg. 2 results in venc=$[153.73, 25.62, 30.75]^T$ cm/s. Because PRoM uses a 95.2% larger $m_{13}$ thereby potentially leading to more intravoxel dephasing, ODV and SDV are advantaged by assuming no intravoxel dephasing: $[s_{11}, s_{21}, s_{31}]=[20,20,20]$. RMSE is calculated averaged over $10^5$ trials at each true v on [−150,150] cm/s sampled every 0.5 cm/s.

To simulate the complex intravoxel dephasing and assess estimator performance in this case, vessels are simulated with circularly symmetric parabolic velocity profiles, as seen in prior works. Parameters include: 0.1 $mm^3$ isotropic resolution and $N_c=1$ coil. The five vessels share the same peak velocity 60 cm/s but have different diameters of 5.5,3.9,3.2,2.7,2.4 mm. The proton density is set to be 30% in the background region and 50% in the static tissue region compared to that in the vessel regions. The complex signal is generated using (3) with symmetric three-point encoding such that venc=$[60,20,30]^T$ cm/s. Regions of 5×5×5 voxels are merged into one to generate intravoxel dephasing and 0.5 $mm^3$ isotropic resolution. Then i.i.d. white complex Gaussian noise is added to make the maximum $s_{\alpha\beta}$ for all voxels in the vessel regions reach 30. No post-processing is used with PRoM to allow for pure comparison of per-voxel estimation performance in various dephasing scenarios.

B. Phantom

A phantom experiment allows for a controlled comparison of estimation performance.

An agarose gel-filled cylindrical container is used to generate the MRI signal. An air-coupled propeller rotates the container. The rotational rate is counted with a photomicrosensor. The phantom was scanned on a 1.5 T scanner (Siemens MAGNETOM Avanto). The in-plane bottom to top velocity increases linearly with the distance from the center of the container. In this experiment, the vertical component of the in-plane velocity is encoded using a symmetric three-point acquisition, and the velocity component ranges from −240 to 240 cm/s. The acquisition parameters include:

$$N_c = 16 \text{ coils};\ venc = \left[200,\ 100,\ \frac{500}{3}\right]^T \text{cm/s};$$

field-of-view (FOV) 520×260 mm; flip angle 5°; TR 4.38 ms; TE 2.66 ms; and, matrix size 192×125. There are 15 repeated acquisitions. The averaged k-space is used as a reference to calculate the RMSE and aliasing error for all voxels except the background region across 15 scans. For per-frame post-processing of PRoM, voxels with less than 30% maximum voxel magnitude are masked, and only the two most likely velocity estimates are considered. Locally weighted quadratic surface class, U, is adopted using a span of 25% closest points and $\lambda=1$.

C. In Vivo

An in vivo experiment is used to verify that PRoM can unwrap velocity on an interval $\Omega$ larger than twice the largest venc, $venc_{21}$, as claimed in (47). A healthy volunteer was scanned on a 3T scanner (Siemens MAGNETOM Vida). For the recruitment and consent of human subject used in this study, the ethical approval was given by an Internal Review Board (2005H0124) at The Ohio State University. The venc scouting scan showed the maximum absolute value of velocity to be above 90 cm/s and less than 100 cm/s. A breath-held, $N_c$=30 coils, symmetric three-point encoding PC-MRI dataset was collected, with the imaging plane intersecting both the ascending aorta and descending aorta; through-plane velocity was encoded. Other acquisition parameters include: FOV 360×270 mm; flip angle 15°; TR 5.56 ms; TE 3.69 ms; matrix size 192×108; and, cardiac phases, 13. The three-point acquisition is designed using Ag. 2 for: [P, Q]=[10,10], [$s_{1\beta}$, $s_{2\beta}$, $s_{3\beta}$]=[5,10,5], [$\epsilon_1$, $\epsilon_2$]=[$10^{-6}$, $10^{-6}$]), $\Omega_\epsilon$=200 cm/s, $$\gamma m_T = \frac{\pi}{40} \text{ s/cm}.$$

The design results in $\xi$=5/3 with highest first moment $$\frac{\pi}{\gamma m_{13}} = 42 \text{ cm/s}.$$

Restricted by input precision number of the scanner interface, venc=$[520.5,21,35]^T$ cm/s; the resulting unambiguous range is Ω=210 cm/s, which is double the range [−52.5,52.5) cm/s of SDV processing. For per-frame post-processing of PRoM, after square-root sum-of-squares coil combination, voxels less than 30% maximum image were masked, and only the two most likely velocity estimates were considered. Due to the complex velocity map across the FOV, locally weighted quadratic surface class, U, was adopted using a span of 3% closest points and λ=1.

IV. Results

A. Simulation Results

Figure 7:
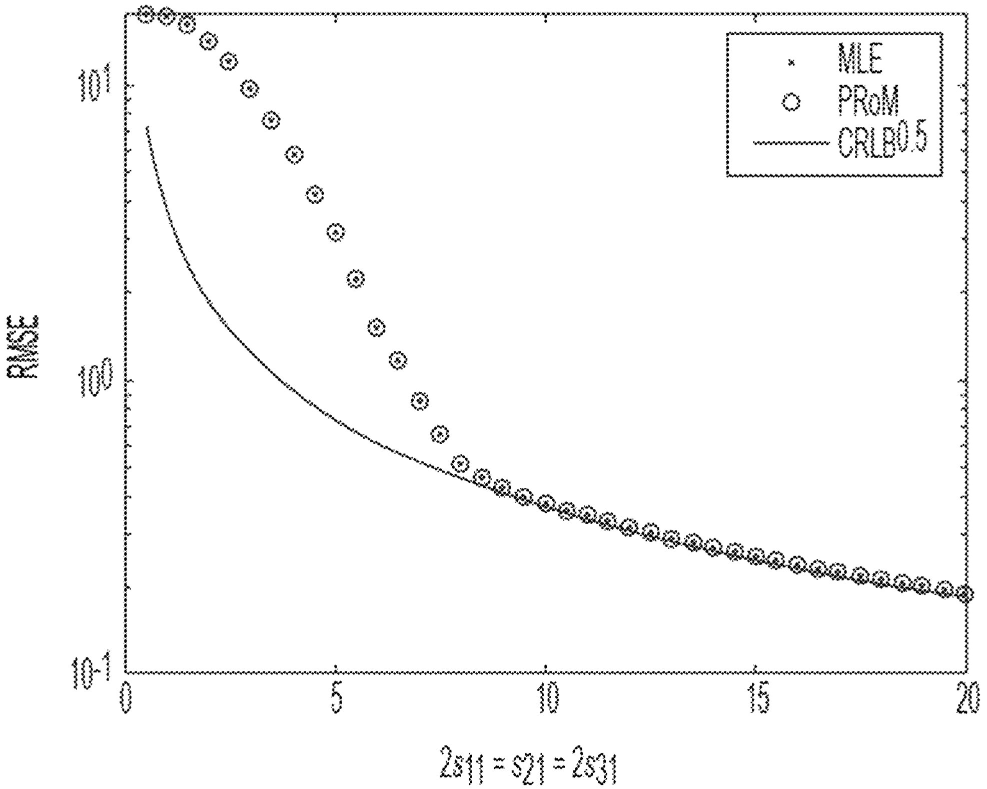
FIG. 7 illustrates that PRoM very closely approximates the maximum likelihood estimator.

FIG. 7 numerically explores the approximations adopted in PRoM. The square root of the CRLB is plotted versus $s_{21}$ for the model in (3) and provides a lower bound on the RMSE for any unbiased estimator. The bound is from a local analysis of the likelihood function, and thus optimistically does not consider unwrapping errors. Superimposed are the RMSE values for both the MLE from the complex measurements and PRoM. For low SNR, both estimators diverge from the bound due to unwrapping errors. Both the MLE and PRoM asymptotically coincide with $CRLB^{0.5}$. Moreover, throughout the entire range of noise powers considered, the RMSE difference between MLE and PRoM is negligible, hence justifying the characterization of PRoM as an approximate MLE and validating the assumptions adopted in the derivation of the PRoM estimator.

Figure 8A:
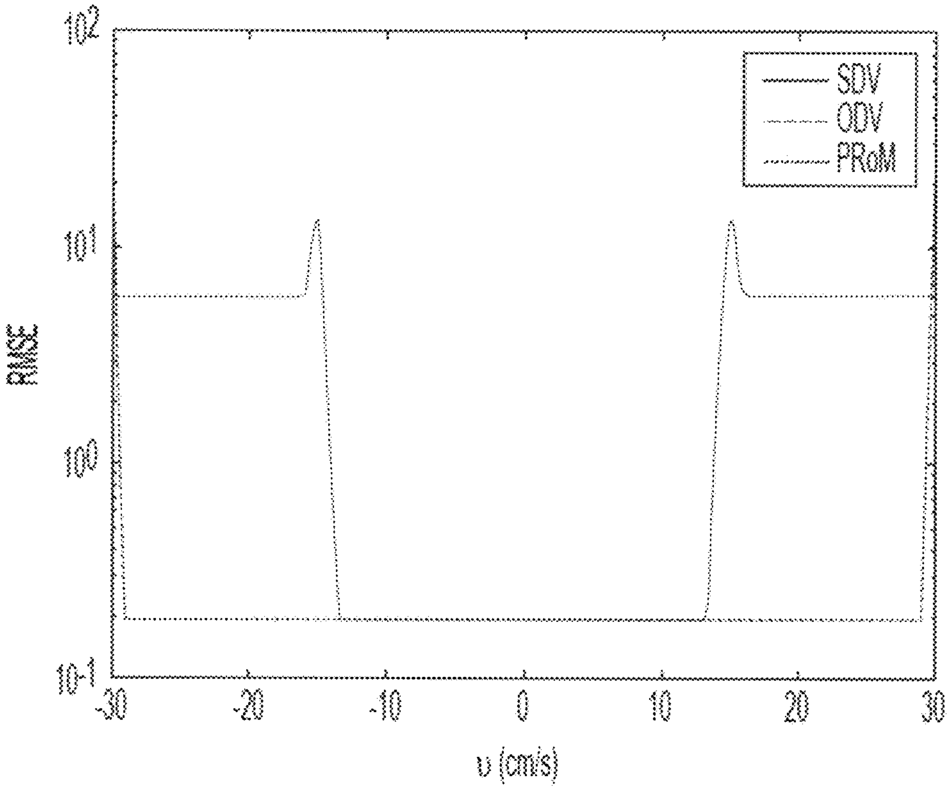
FIGS. 8A-8B show the RMSE results averaged over 10s trials at each true velocity value with grid 0.1 cm/s.
Figure 8B:
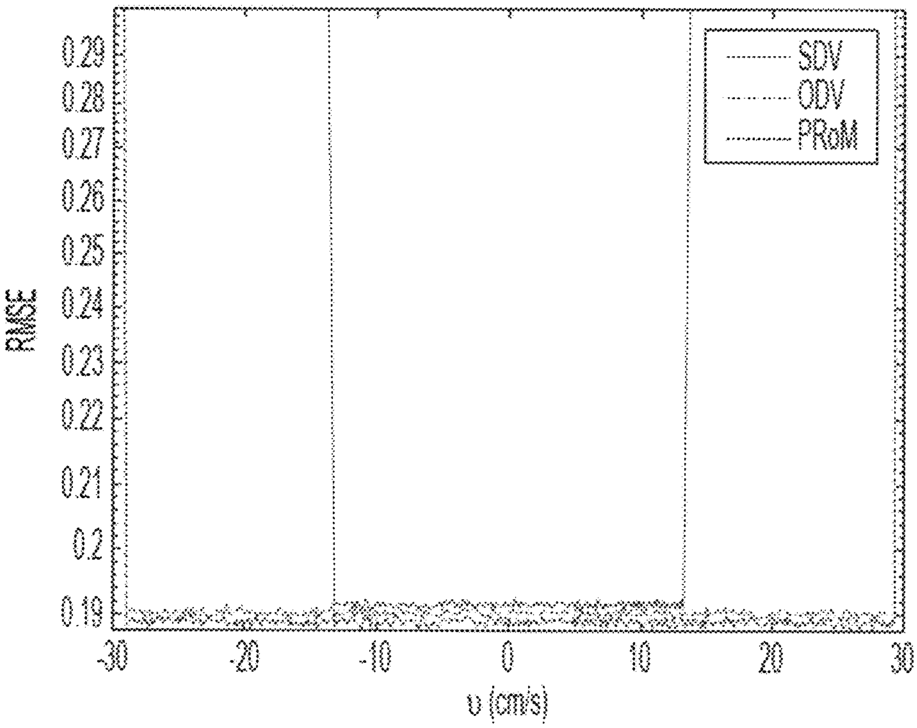

FIGS. 8A-8B show the RMSE results for the same acquisition as in FIG. 7 with $10^5$ trials at each true velocity value with grid 0.1 cm/s. Both ODV and PRoM can unwrap a large range of velocities. FIG. 8B provides a zoomed view. PRoM improves RMSE by modeling the non-zero noise correlation between phase difference measurements.

Figure 9A:
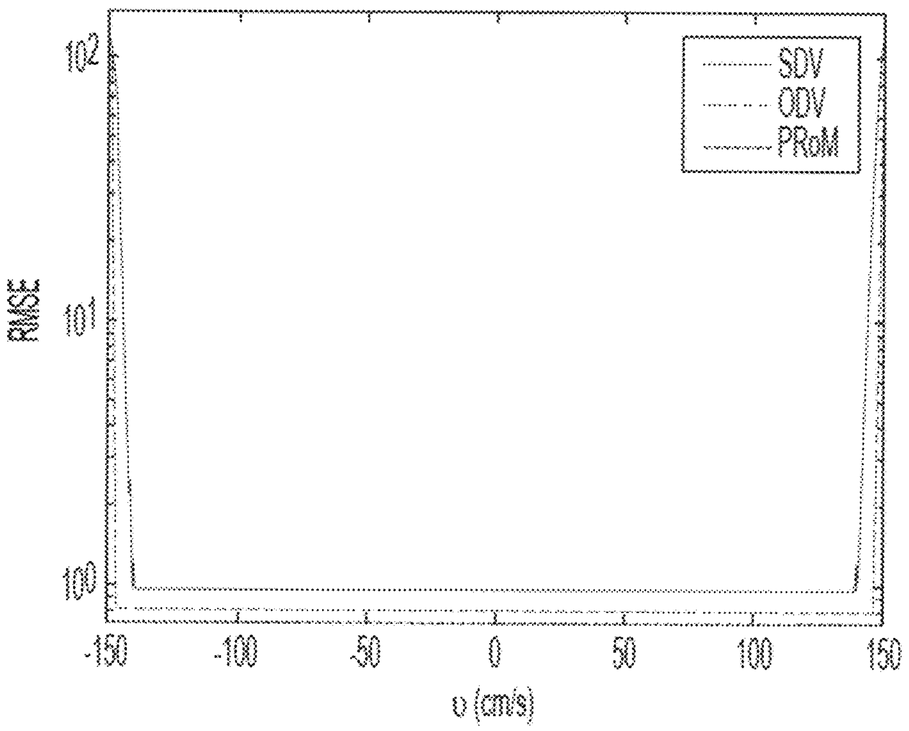
FIGS. 9A-9B show the RMSE improvement enabled by optimized venc design.
Figure 9B:
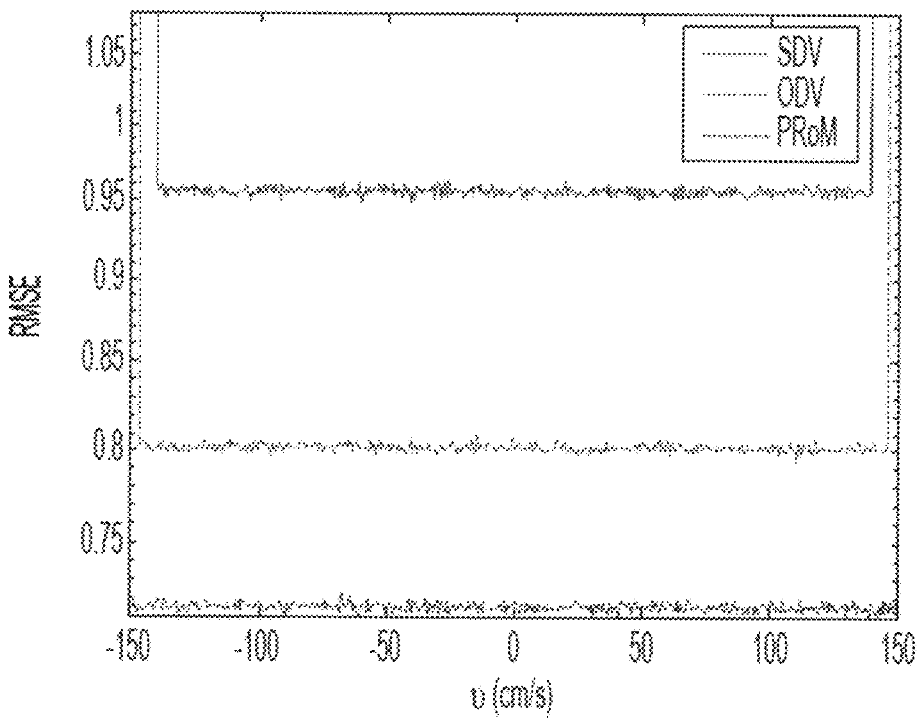
Figure 10A:
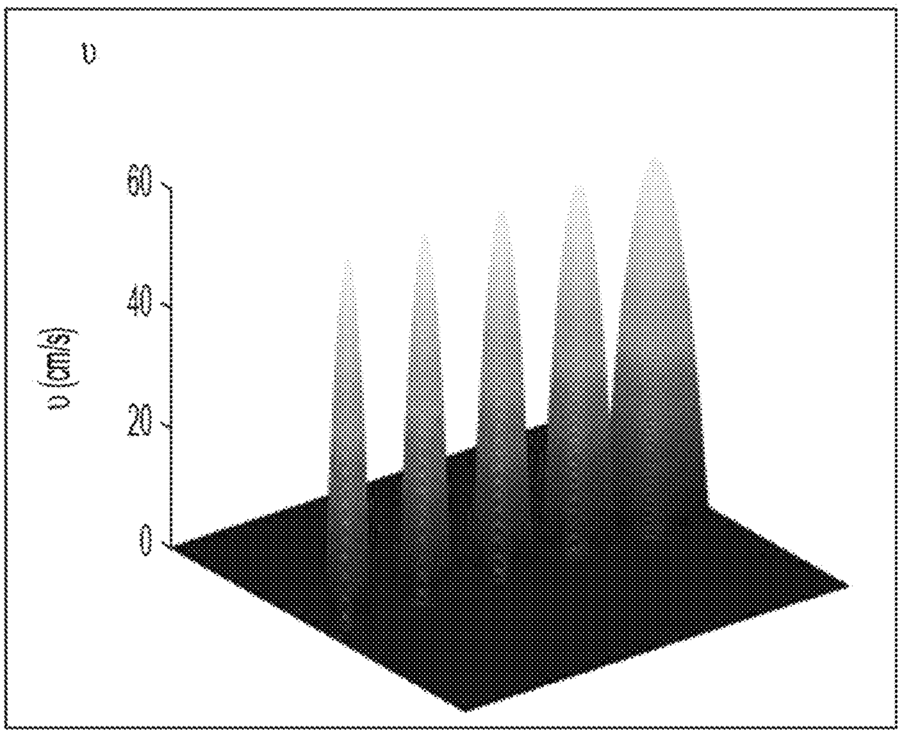
FIGS. 10A-10H show the result for simulation of intra-voxel dephasing.
Figure 10B:
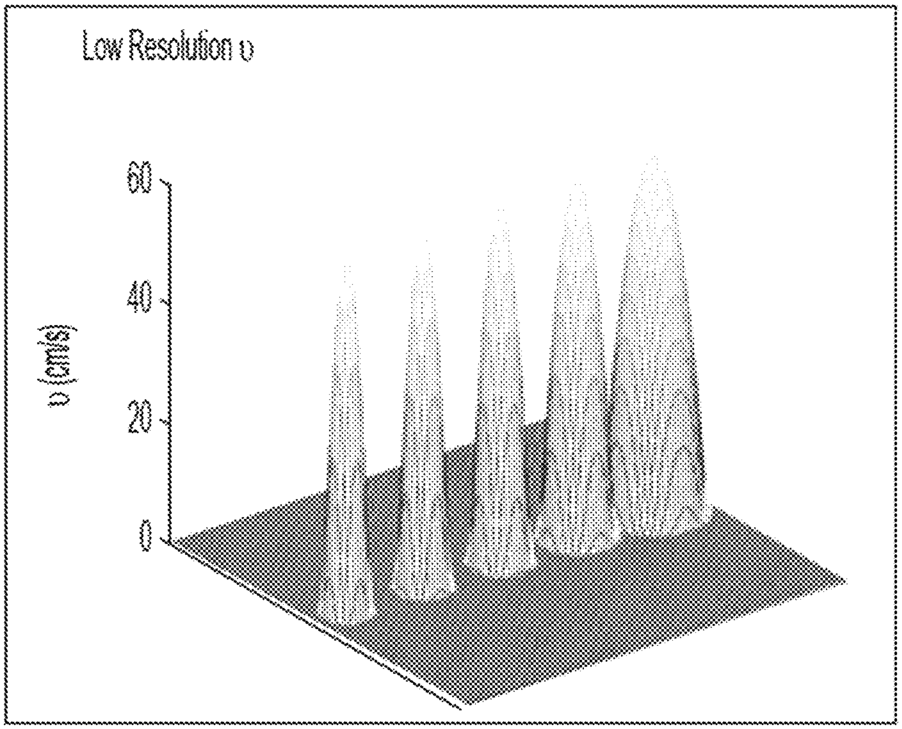
Figures 10C, 10D, 10E:
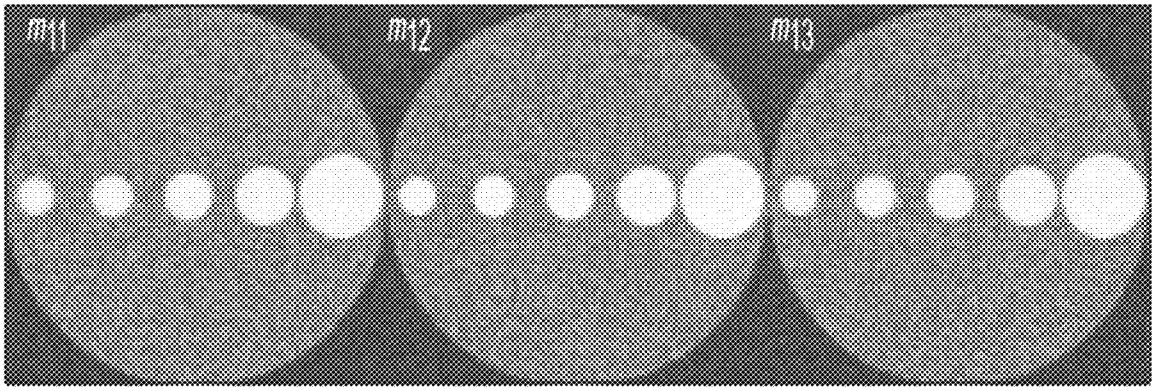
Figures 10F, 10G, 10H:
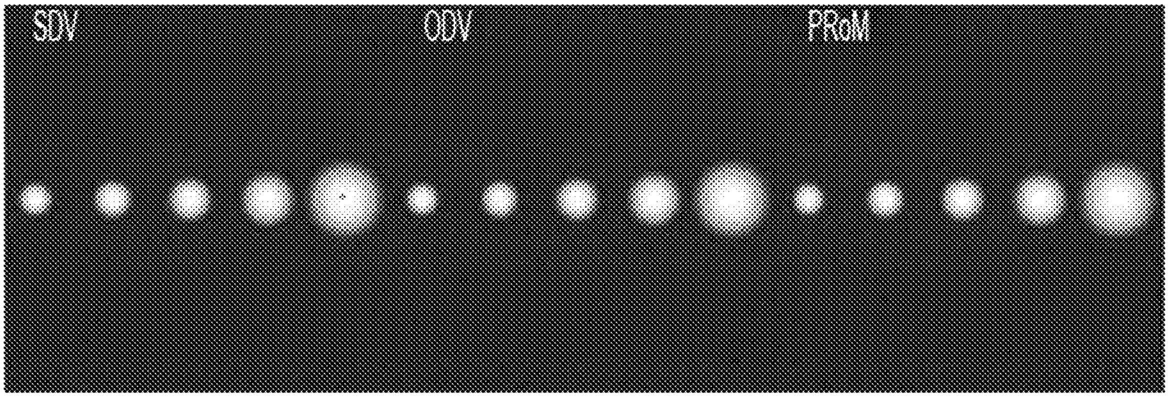

FIGS. 9A-9B illustrate the benefit of optimized design. Results are computed for the same acquisition as in FIG. 7 with $10^5$ trials at each true velocity value with grid 0.1 cm/s. Here, ODV and SDV are advantaged by assuming no intra-voxel dephasing for their acquisition. For PRoM, intravoxel dephasing is present with $2s_{11}$=$s_{21}$=$2s_{31}$. The PRoM design uses $\xi$=6/5, which explicitly suppresses both Unwrapping Errors and Aliasing Errors to ensure reliable estimation across the full range, [−150,150] cm/s. Further, despite the handicap of simulated 50% intravoxel dephasing, PRoM still provides a 10.5% decrease in RMSE compared to ODV and a 25.1% decrease versus SDV used with its recommended acquisition strategy.

Figure 11A:
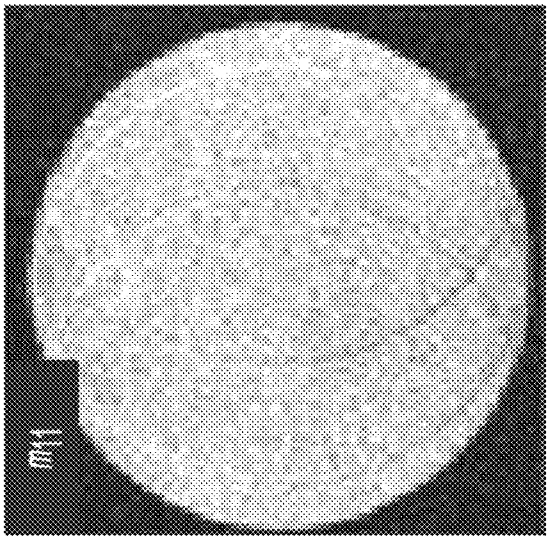
FIGS. 11A-11C show measured data from the spinning phantom and illustrate the square root of sum of squared coil images for $m_{11}$, $m_{12}$, $m_{13}$.
Figure 11B:
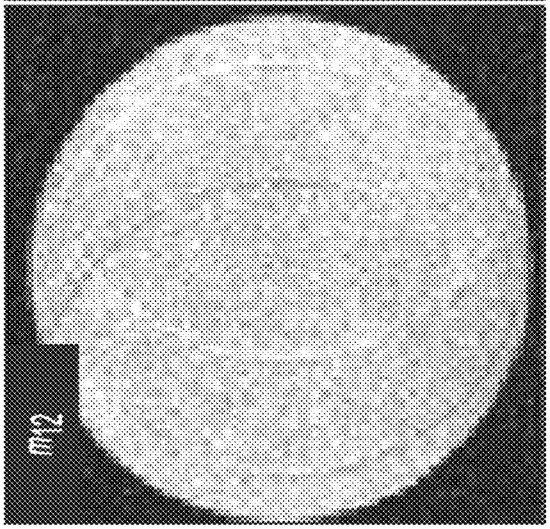
Figure 11C:
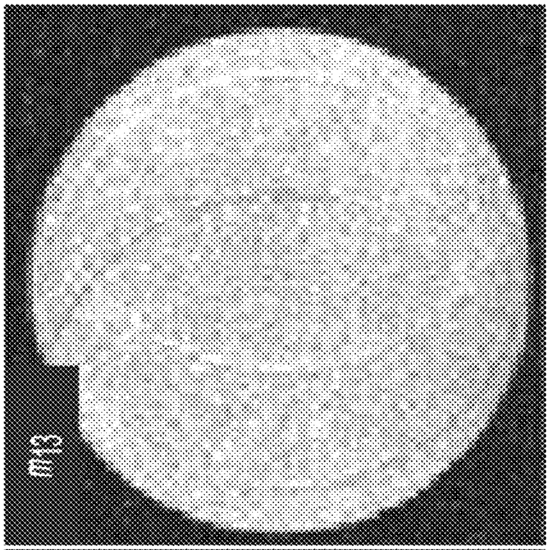
Figures 11D, 11E, 11F, 11G, 11H, 11I, 11J, 11K:
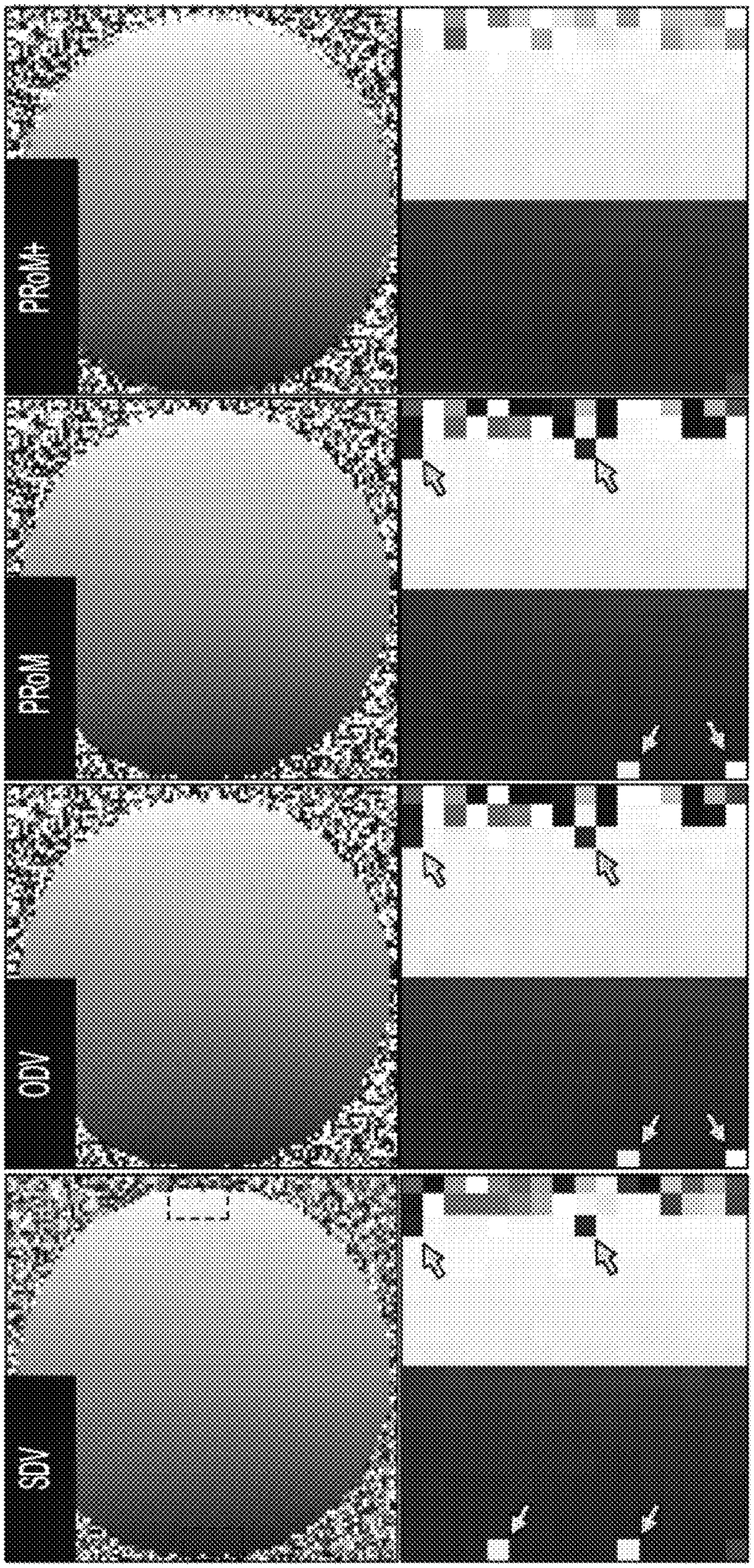
FIGS. 11D-11G show measured data from the spinning phantom and illustrate velocity estimates from SDV, ODV, PRoM, and PRoM+.
FIGS. 11H-11K are zoomed-in versions of FIGS.

FIGS. 10A-10H show the result for simulation of intravoxel dephasing. FIG. 11A is the velocity profile simulated with refined resolution and FIG. 11B is the lower acquired resolution which leads to intravoxel dephasing. FIG. 11C, FIG. 11D and FIG. 11E illustrate intravoxel dephasing for $m_{11}$,$m_{12}$,$m_{13}$. More serious intravoxel dephasing is observed in $m_{11}$,$m_{13}$ and at voxels close to the boundaries of the simulated vessels. FIG. 11F, FIG. 11G, and FIG. 11H show the recovered velocity. Aliasing error is observed in the SDV estimated velocity, but not in ODV and PRoM. The RMSE values for SDV, ODV and PRoM are 120.27, 10.24 and 10.12 cm/s, respectively. Moreover, the RMSE given no Aliasing Error for SDV, ODV, and PRoM are 10.23,10.24, and 10.12 cm/s, respectively.

B. Phantom Results

FIGS. 11A-11K use measured data from a spinning phantom to evaluate RMSE in velocity estimation. In addition, the phantom data validate that both ODV and PRoM paired with simple post-processing can reliably unwrap a larger range of velocities than SDV, given the same encodings. The number of aliased voxels and RMSE values are reported in Table 1. The PRoM+iteration is observed for all frames to converge in only two iterations. In this instance, PRoM+ eliminates aliasing errors and reduces RMSE by 25.8% versus ODV, and 48.5% compared to SDV.

TABLE 1

| Metric | SDV | ODV | PRoM | PRoM+ |
|---|---|---|---|---|
| Number of aliased voxels | 27 | 5 | 5 | 0 |
| RMSE, all voxels (cm/s) | 6.08 | 4.22 | 3.85 | 3.13 |
| RMSE, excluding aliasing (cm/s) | 3.22 | 3.59 | 3.13 | 3.13 |

C. In Vivo Results

Figures 12A, 12B, 12C:
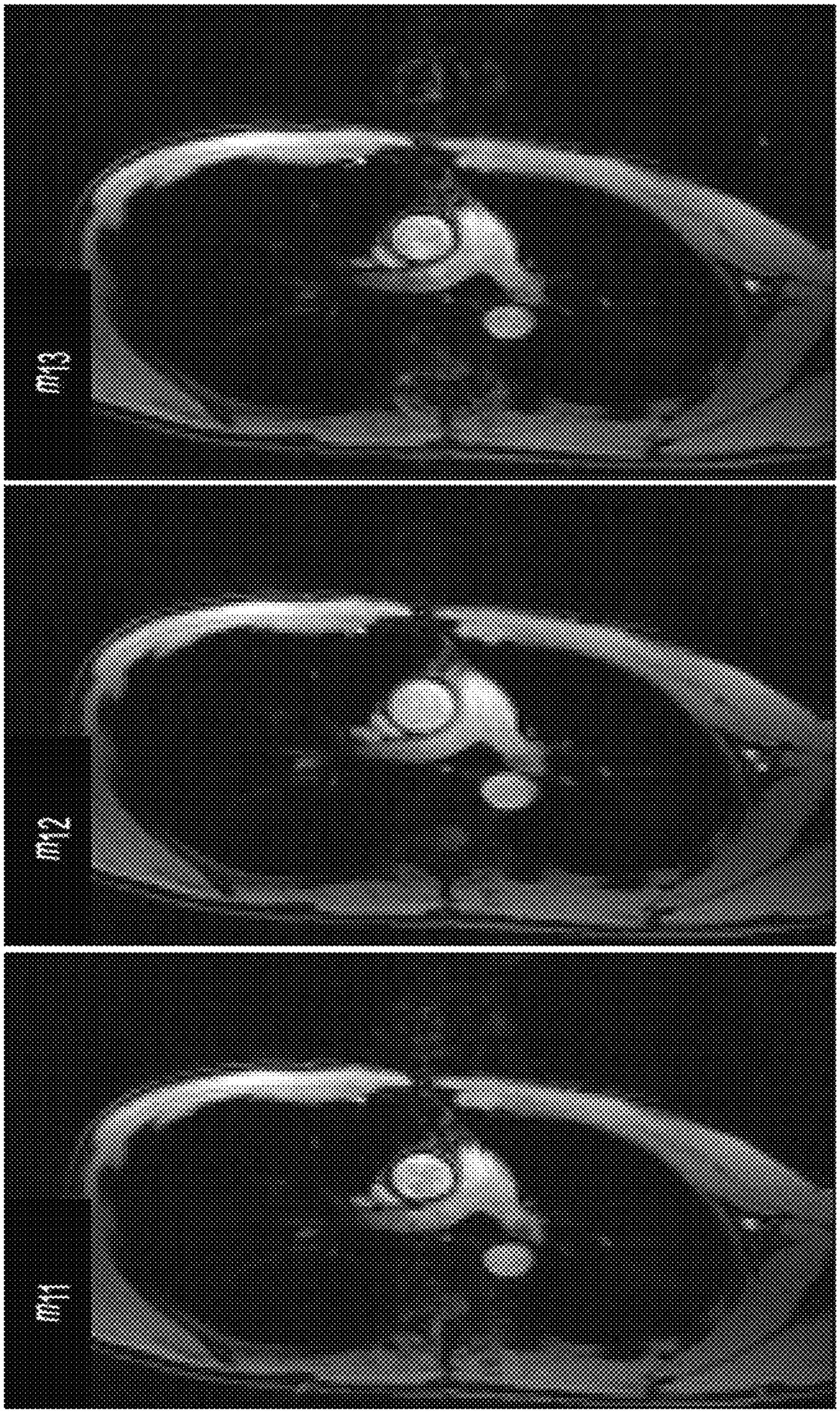
FIGS. 12A-12C show measured data from a healthy volunteer to validate that PRoM and PRoM+ can unwrap a larger range of velocities than existing techniques, given the same encodings and illustrate the square root of sum of squared coil images for mu, $m_{12}$, $m_{13}$.
Figures 12D, 12E, 12F, 12G, 12H, 12I, 12J, 12K:
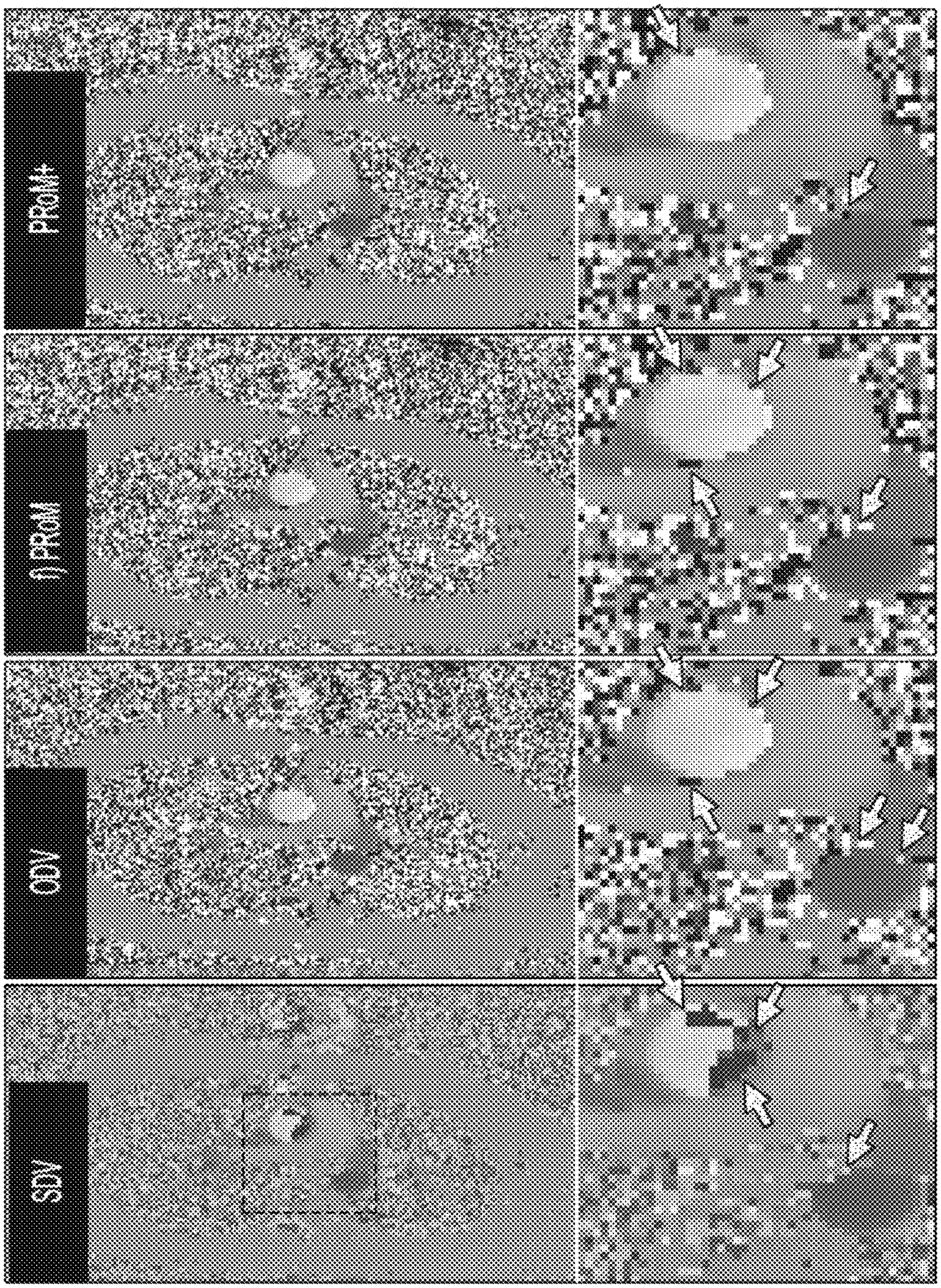
FIGS. 12D-12G show measured data from the healthy volunteer and illustrate velocity estimates from SDV, ODV, PRoM, and PRoM+.
FIGS. 12H-12K are zoomed-in versions of FIGS.

FIGS. 12A-12K show in vivo results. FIGS. 12A-12C show more serious intra-voxel dephasing for ma and $m_{13}$ compared to $m_{12}$. Because the largest absolute value of true velocity is larger than the largest venc of 52.5 cm/s, significant aliasing is observed in SDV recovery from FIG. 12E. However, FIG. 12E and FIG. 12F illustrate that both ODV and PRoM can recover velocities larger than the largest venc. Here, the acquisition designed for PRoM departs from the =3/2 heuristic to use $\xi$=5/3, resulting in an unambiguous range of velocities four times that for standard dual-venc for the same highest venc. FIG. 12G illustrates that PRoM+ can incorporate spatial correlations to improve unwrapping performance. For the in vivo example using coil-combined image: ODV computation takes 9.106 seconds, and PRoM takes 2.246 seconds, with an additional 1.717 seconds for PRoM+. The iteration of PRoM+ is observed to converge in only two steps for all frames.

V. Discussion

For the simulation and phantom studies, where the ground truth is available, PRoM offers a significant RMSE advantage over standard dual venc processing, i.e., 25.1% for the simulation study and 48.5% for the phantom study. Although PRoM offers a fourfold computation advantage over ODV, its RMSE advantage over ODV, when both methods use the same venc values, is marginal. However, there are two features that distinguish PRoM from ODV, NCO, and other dual-venc methods. First, PRoM allows for an optimized venc design, which can translate to a more significant reduction in RMSE, as evident by 10.5% reduction in RMSE over ODV (FIG. 9).

Second, PRoM can leverage the conditional probabilities of different wrapping integers to enable a new mechanism for phase unwrapping.

The presentation here for PRoM is limited to a single component of velocity; extension to the estimation of all three velocity components, and hence congruence equations in multiple variables, is ongoing work.

Several three-point encoding have been proposed and validated for PC-MRI aiming to improve VNR or unambiguous velocity range. Although performance depends strongly on vencs, the selection of vencs has been based on heuristics. PRoM, for the first time, provides an avenue to optimize vencs. FIGS. 12A-12K demonstrates that the PRoM-inspired design procedure in Alg. 2 can provide an unambiguous velocity range more than four times as large as the highest venc. The acquisition in FIGS. 12A-12K illustrates the derivation in (47) and the associated design procedure in Alg. 2. Indeed, the design procedure allows the range to grow to the greatest extent allowed by the presumed noise floor, which is given as an input to the design. The design then minimizes the predicted RMSE while meeting constraints on unwrapping errors, reliable range of velocities, and maximum first moment. In the regime of low SNR, the PRoM design yields $\xi=3/2$, coinciding with a conventional heuristic. The Alg. 2 design provides unwrapping and velocity range guarantees, given a noise floor and bound on the highest first moment. For any higher SNR encountered, the guarantee still holds, and the RMSE reduces according to (27).

For volumetric imaging applications with vast numbers of voxels, the processing speed of PRoM may provide a desirable benefit. The careful pruning of the set of candidate wrapping integers results in a fast estimator without expensive grid search or gradient-based iterative optimization.

PRoM+ provides a simple but effective post-processing strategy for PRoM, which only affects the choice of k from a Bayesian perspective. It differs from conventional unwrapping algorithms that typically only allow $\pm 2\pi$ adjustment in the possibly wrapped phases. And, the processing incorporates the relative conditional probabilities of different wrapping integers, which are available as a byproduct of the PRoM algorithm. This strategy can be easily generalized to multiple velocity components and high-dimensional imaging.

Figure 13:
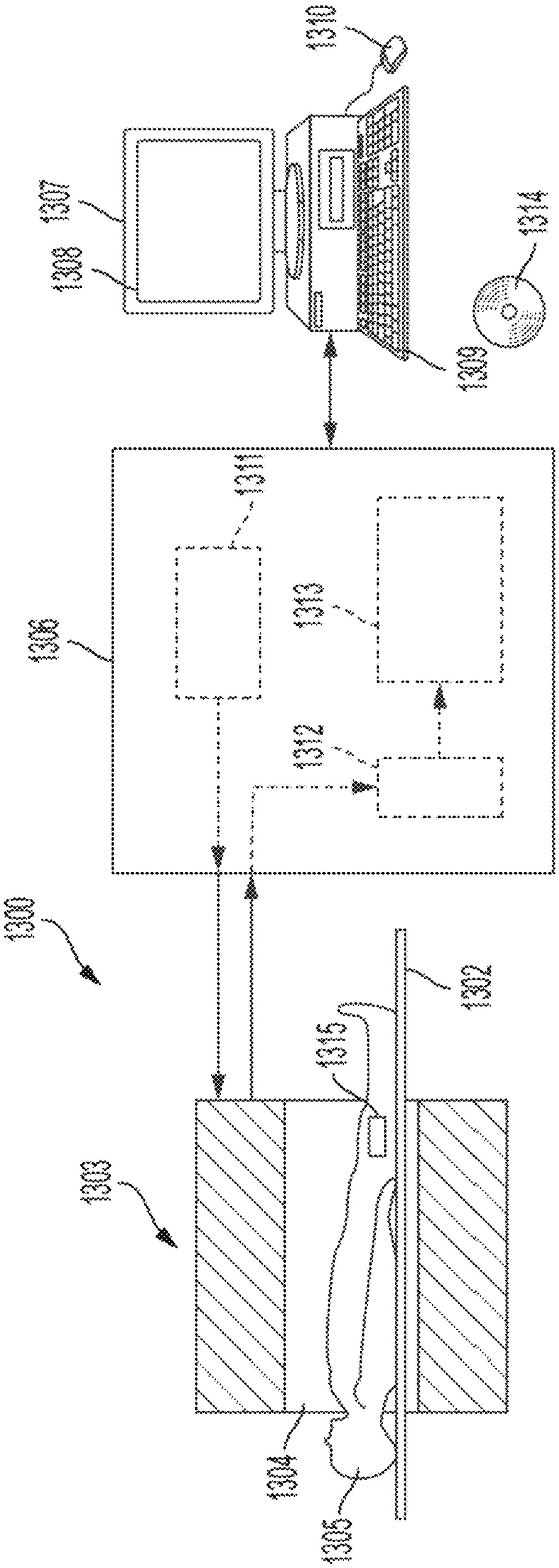
FIG. 13 is a view illustrating a structure of an example magnetic resonance imaging (MRI) apparatus that may be used to acquire image data.

FIG. 13 is a view illustrating a structure of an example magnetic resonance imaging (MRI) apparatus 1300 that may be used to acquire image data. Generally, the MRI apparatus 1300 is a low-field or high-field system equipped with a high-end data processing unit (DPU) to enable the implementation of structure aware (SA) recovery in clinically relevant times. The DPU may be comprised of multiple GPUs running, e.g., a Gadgetron framework, which was developed at the National Heart, Lung, and Blood Institute. The SA recovery methods are based on Bayesian inference where the structure in the image is expressed probabilistically, as a set of priors or conditional priors. For implementation of SA recovery, fast iterative image recovery methods based on Generalized Approximate Message Passing (GAMP) may be employed, yielding fast algorithms with self-tuning parameters.

The MRI apparatus 1300 includes a scanner 1303 that generates magnetic fields used for the MR examination within a measurement space 1304 having a patient table 1302. In accordance with the present disclosure, the scanner 1303 may include a wide bore 70 cm superconducting magnet having a field strength of approximately 0.5-3.0 Tesla (T).

A controller 1306 includes an activation unit 1311, a receiver device 1312 and an evaluation module 1313. During a phase-sensitive flow measurement, MR data are recorded by the receiver device 1312, such that MR data are acquired in, e.g., a measurement volume or region 1315 that is located inside the body of a patient 1305. The MRI apparatus 1300 may: include a coil array (e.g., arranged as two 3×3 grids); support parallel imaging using SPIRiT, GRAPPA, SENSE, VISTA, AMP, FISTA, SCoRE, and/or Bayesian Inference; and perform analog-to-digital conversion (ADC) at a gantry of the MRI apparatus 1300.

An evaluation module 1313 prepares the MR data such that they can be graphically presented on a monitor 1308 of a computing device 1307 and such that images can be displayed. In addition to the graphical presentation of the MR data, a three-dimensional volume segment to be measured can be identified by a user using the computing device 1307. The computing device may include a keyboard 1309 and a mouse 1310. The computing device may include a Xeon central processing unit (CPU) or better; 16 GB of random-access memory (RAM); Multi-GPU, K20 or Titan Z reconstruction hardware; support DiCOM 3.0; and support simultaneous scan and reconstruction.

Software for the controller 1306 may be loaded into the controller 1306 using the computing device 1307. Such software may implement a method(s) to process data acquired by the MRI apparatus 1300, as described below. It is also possible for the computing device 1307 to operate such software. Yet further, the software implementing the method(s) of the disclosure may be distributed on removable media 1314 so that the software can be read from the removable media 1304 by the computing device 1307 and be copied either into the controller 1306 or operated on the computing device 1307 itself.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. The present disclosure is capable of other implementations and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary implementations include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example implementations, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

As discussed herein, a "subject" (or "patient") may be any applicable human, animal, or other organism, living or dead, or other biological or molecular structure or chemical environment, and may relate to particular components of the subject, for instance specific organs, tissues, or fluids of a subject, may be in a particular location of the subject, referred to herein as an "area of interest" or a "region of interest" (ROI).

We claim:

1. A method for Phase Recovery from Multiple Wrapped Measurements (PRoM), comprising:
- constructing a set of candidate tuples of wrapping integers;
- at each candidate tuple of wrapping integers, performing a linear combination using an approximate conditional maximum likelihood estimator; and
- providing an estimate of through-plane velocity at an image voxel.

2. The method of claim 1, wherein a probability that a true tuple of wrapping integers is in this set is arbitrarily close to one.

3. The method of claim 1, wherein the approximate conditional maximum likelihood estimator accounts for noise variance and correlation in the relative phases of image voxels across all encodings.

4. The method of claim 1, further comprising producing an efficiently pruned list of candidate wrapping integers.

5. The method of claim 1, further comprising producing a spatially adaptive, data-driven estimator of the scaled noise covariance matrix for phase differences.

6. The method of claim 5, wherein the method is performed without reliance on direct measurement of per-voxel noise power.

7. The method of claim 5, further comprising incorporating effects of spin dephasing.

8. The method of claim 1, further comprising producing a posterior probability distribution of the velocity estimate at each voxel.

9. The method of claim 8, further comprising an optimized design of data acquisition to minimize mean-squared estimation error subject to constraints on at least one of minimum range of unaliased velocities; upper bound on first moment of the time-varying magnetic field gradient; upper bound on per-voxel probability of unwrapping error.

10. The method of claim 8, further comprising spatial post-processing to reduce bias due to phase unwrapping errors.

11. An MRI apparatus, comprising:
- a scanner that generates magnetic fields used for the MR examination;
- a measurement space having a patient table; and
- a controller having an evaluation module,
- wherein the evaluation module executes instructions for performing a method for Phase Recovery from Multiple Wrapped Measurements (PRoM) that includes:
  - constructing a set of candidate tuples of wrapping integers;
  - at each candidate tuple of wrapping integers, performing a linear combination using an approximate conditional maximum likelihood estimator;
  - spatially post-processing to further remove bias from phase unwrapping errors; and
  - providing an estimate of through-plane velocity at each voxel in an array of voxels.

12. The apparatus of claim 11, wherein a probability that a true tuple of wrapping integers is in this set is arbitrarily close to one.

13. The apparatus of claim 11, wherein the approximate conditional maximum likelihood estimator accounts for noise variance and correlation in the relative phases of image voxels across all encodings.

14. The apparatus of claim 11, wherein an efficiently pruned list of candidate wrapping integers is produced.

15. The apparatus of claim 11, wherein a spatially adaptive, data-driven estimator of the scaled noise covariance matrix for phase differences is produced.

16. The apparatus of claim 15, wherein the method executed by the apparatus is performed without reliance on direct measurement of per-voxel noise power.

17. The apparatus of claim 15, wherein effects of spin dephasing are incorporated.

18. The apparatus of claim 11, wherein a posterior probability distribution of the velocity estimate at each voxel is produced.

19. The apparatus of claim 18, wherein a design of data acquisition is optimized to minimize mean-squared estimation error subject to constraints on at least one of minimum range of unaliased velocities; upper bound on first moment of the time-varying magnetic field gradient; upper bound on per-voxel probability of unwrapping error.

20. The apparatus of claim 18, wherein spatial post-processing is used to reduce bias due to phase unwrapping errors.

* * * * *